US008912697B2

(12) United States Patent
Watanabe et al.

(10) Patent No.: US 8,912,697 B2
(45) Date of Patent: Dec. 16, 2014

(54) VACUUM ACTUATOR INCLUDING A STATOR FORMING A PART OF A VACUUM PARTITION WALL

(75) Inventors: Kazuhito Watanabe, Tama (JP); Yukihito Tashiro, Chofu (JP); Naoyuki Nozawa, Inagi (JP); Daisuke Kobinata, Tokyo (JP); Hideo Mano, Chofu (JP)

(73) Assignee: Canon Anelva Corporation, Kawasaki-Shi, Kanagawa-Ken (JP)

( * ) Notice: Subject to any disclaimer, the term of this patent is extended or adjusted under 35 U.S.C. 154(b) by 0 days.

(21) Appl. No.: 12/974,662

(22) Filed: Dec. 21, 2010

(65) Prior Publication Data

US 2011/0156514 A1 Jun. 30, 2011

(30) Foreign Application Priority Data

Dec. 25, 2009 (JP) ................................. 2009-295148
Mar. 4, 2010 (JP) ................................. 2010-047573
Mar. 4, 2010 (JP) ................................. 2010-047574

(51) Int. Cl.
*H02K 5/10* (2006.01)
*H02K 3/00* (2006.01)
*H01L 21/677* (2006.01)
*H02K 5/128* (2006.01)

(52) U.S. Cl.
CPC .......... *H02K 5/128* (2013.01); *H01L 21/67742* (2013.01)
USPC ........... 310/86; 310/187; 310/192; 414/744.5

(58) Field of Classification Search
CPC ............ H02K 5/28; H02K 16/00; B25J 9/126

USPC ..................... 310/49.26, 49.31, 86, 187, 192, 310/216.009; 414/744.5
See application file for complete search history.

(56) References Cited

U.S. PATENT DOCUMENTS

| 5,899,658 | A  | * | 5/1999 | Hofmeister ................ 414/744.5 |
| 6,897,588 | B2 |  | 5/2005 | Okubo |
| 2004/0012471 | A1 | * | 1/2004 | Kojima et al. ................ 336/120 |
| 2005/0231051 | A1 | * | 10/2005 | Chen ............................... 310/86 |
| 2006/0108890 | A1 | * | 5/2006 | Hauger et al. ................ 310/214 |
| 2007/0280813 | A1 | * | 12/2007 | Nakamura et al. ......... 414/744.5 |
| 2010/0101075 | A1 |  | 4/2010 | Hagiwara et al. |

FOREIGN PATENT DOCUMENTS

| JP | 58-049059 A | 3/1983 |
| JP | 62-51943 U | 3/1987 |
| JP | 64-16157 U | 1/1989 |

(Continued)

OTHER PUBLICATIONS

Machine Translation JP2001352708(2001).*

(Continued)

*Primary Examiner* — Tran Nguyen
*Assistant Examiner* — Jose Gonzalez Quinones
(74) *Attorney, Agent, or Firm* — Buchanan Ingersoll & Rooney PC

(57) ABSTRACT

A vacuum actuator includes a vacuum partition wall, the interior of which can be evacuated to a vacuum, a rotor supported by the vacuum partition wall to be free to rotate, a permanent magnet provided on the outer peripheral surface of the rotor, a coil opposed to the permanent magnet, and a stator provided with the coil. The stator and the vacuum partition wall are formed integrally with each other.

12 Claims, 20 Drawing Sheets

(56) References Cited

FOREIGN PATENT DOCUMENTS

| | | | |
|---|---|---|---|
| JP | 5-316706 A | | 11/1993 |
| JP | 08289513 A | * | 11/1996 |
| JP | 2000069696 A | * | 3/2000 |
| JP | 2000069741 A | * | 3/2000 |
| JP | 2001-112223 A | | 4/2001 |
| JP | 2001112223 A | * | 4/2001 |
| JP | 2001352708 A | * | 12/2001 |
| JP | 2002315281 A | * | 10/2002 |
| JP | 2004-194489 A | | 7/2004 |
| JP | 2004336889 A | * | 11/2004 |
| JP | 2005086860 A | * | 3/2005 |

OTHER PUBLICATIONS

Machine Translation JP2000069696 (2000).*
Machine Translation JP2001112223 (2001).*
Machine Translation JP2002315281 (2002).*
Machine Translation JP2004336889 (2004) and JP2005086860 (2005).*
Office Action (Notification of Reasons for Refusal) issued on Sep. 22, 2014, by the Japan Patent Office in corresponding Japanese Patent Application No. 2010-279845, and an English Translation of the Office Action. (6 pages)

* cited by examiner

F I G. 10
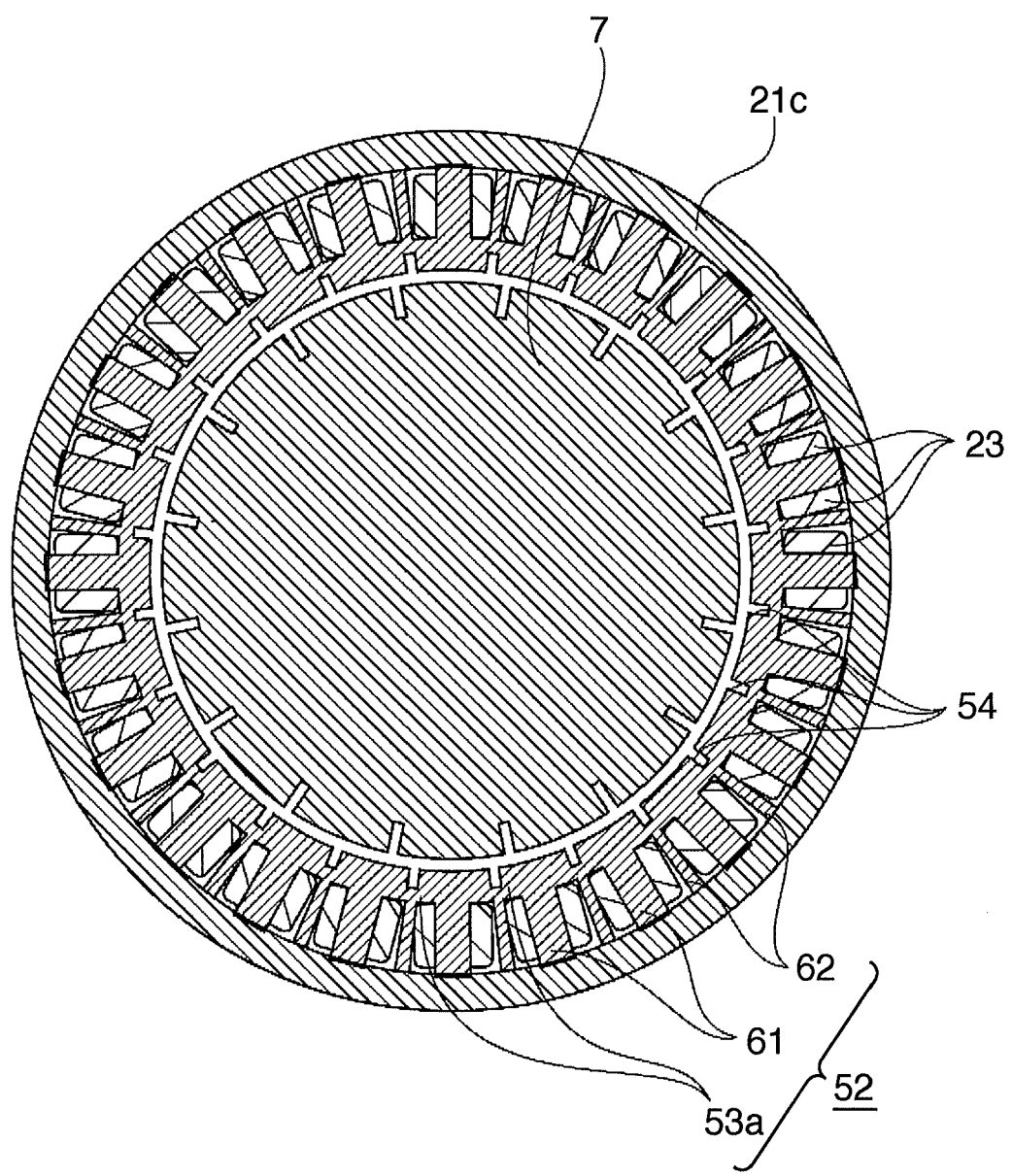

VACUUM ACTUATOR INCLUDING A STATOR FORMING A PART OF A VACUUM PARTITION WALL

BACKGROUND OF THE INVENTION

1. Field of the Invention

The present invention relates to a vacuum actuator that drives a mechanism portion in a vacuum atmosphere, and a substrate transport robot and, more particularly, to a vacuum actuator which serves as a driving source for a transport apparatus which transports, for example, a substrate in a vacuum atmosphere, and a substrate transport robot having the vacuum actuator.

2. Description of the Related Art

As an actuator which drives a mechanism portion in a vacuum atmosphere, an actuator, in which a rotor to which a permanent magnet is attached is disposed on the vacuum side and a stator which generates a magnetic field is disposed on the atmospheric side by disposing a partition wall between the rotor and the stator, has been known (see, for example, Japanese Utility Model Laid-Open Nos. 62-51943 and 64-16157 and Japanese Patent Laid-Open Nos. 2001-112223 and 05-316706).

A coil of the stator is formed by winding a conductive wire and therefore has a surface area corresponding to the length of the conductive wire. Any adverse effect that an out-gas discharged from the coil exerts on the vacuum side is prevented by providing the actuator with a partition wall which separates the coil from the vacuum side, as in the motors disclosed in Japanese Utility Model Laid-Open Nos. 62-51943 and 64-16157.

However, according to techniques presented in Japanese Utility Model Laid-Open Nos. 62-51943 and 64-16157, because the space which accommodates the rotor and that which accommodates the stator are separated from each other by the partition wall, the permanent magnet fixed on the rotor and the distal end of the stator have a relatively large distance between them. This inevitably keeps low the efficiency (torque constant) at which the torque can be produced in practice by the rotor for a current supplied to the coil. Although a lot of efforts have been made to decrease the thickness of the vacuum partition wall portion, a thickness which generates a rigidity high enough to withstand the atmospheric pressure is required, and gaps must be formed between the partition wall and the rotor and between the partition wall and the stator for interference prevention during operation and in terms of assembly, so no significant improvement can be achieved.

Similarly, because the space which accommodates the rotor and that which accommodates the stator are separated from each other by the partition wall, the rotor is positioned relative to the partition wall. On the other hand, the stator must inevitably be positioned relative to the partition wall as well. This makes it difficult to ensure a given accuracy of positioning the rotor relative to the stator, that is, a given coaxial accuracy between them, thus leading to disadvantages such as an increase in amount of vibration of the motor, deterioration in efficiency, or degradation in assembly performance.

SUMMARY OF THE INVENTION

The present invention has been made in consideration of the above-mentioned problems in relation to a vacuum actuator which drives a mechanism portion in a vacuum atmosphere, and a substrate transport robot, and has as its object to provide a vacuum actuator and substrate transport robot which can significantly improve the magnetic efficiency by shortening the distance between a permanent magnet fixed on a rotor and the distal end of a stator without adversely affecting the degree of vacuum.

It is another object of the present invention to provide a vacuum actuator and substrate transport robot that can improve the accuracy of positioning a rotor relative to a stator, the motor efficiency, and the assembly performance.

According to one aspect of the present invention, there is provided a vacuum actuator comprising:

a vacuum partition wall, an interior of which can be evacuated to a vacuum;

a rotor supported by the vacuum partition wall to be free to rotate;

a permanent magnet provided on an outer peripheral surface of the rotor;

a coil opposed to the permanent magnet; and a stator provided with the coil, wherein the stator and the vacuum partition wall are formed integrally with each other.

According to another aspect of the present invention, there is provided a substrate transport robot comprising the above-mentioned vacuum actuator defined, which serves as a driving source.

With a motor according to the present invention, not only the motor efficiency but also the accuracy of positioning a rotor relative to a stator, the coaxial accuracy, and the assembly performance, can be improved without adversely affecting a vacuum atmosphere. Also, because the stator is covered with no component, it is possible to improve the efficiency of heat dissipation into the atmospheric air, to decrease the amount of increase in heat generation resistance in response to a rise in temperature, and to supply a larger current.

Further features of the present invention will become apparent from the following description of exemplary embodiments with reference to the attached drawings.

BRIEF DESCRIPTION OF THE DRAWINGS

FIG. 10 is a sectional view taken along a line B-B in FIG. 9;

DESCRIPTION OF THE EMBODIMENTS

First Embodiment

The first embodiment of the present invention will be described below with reference to the accompanying drawings. Note that members, arrangements, and other features to be described hereinafter are merely examples in which the present invention is embodied, and do not limit the present invention, so various modifications and changes can be made without departing from the scope of the present invention.

Figure 1:
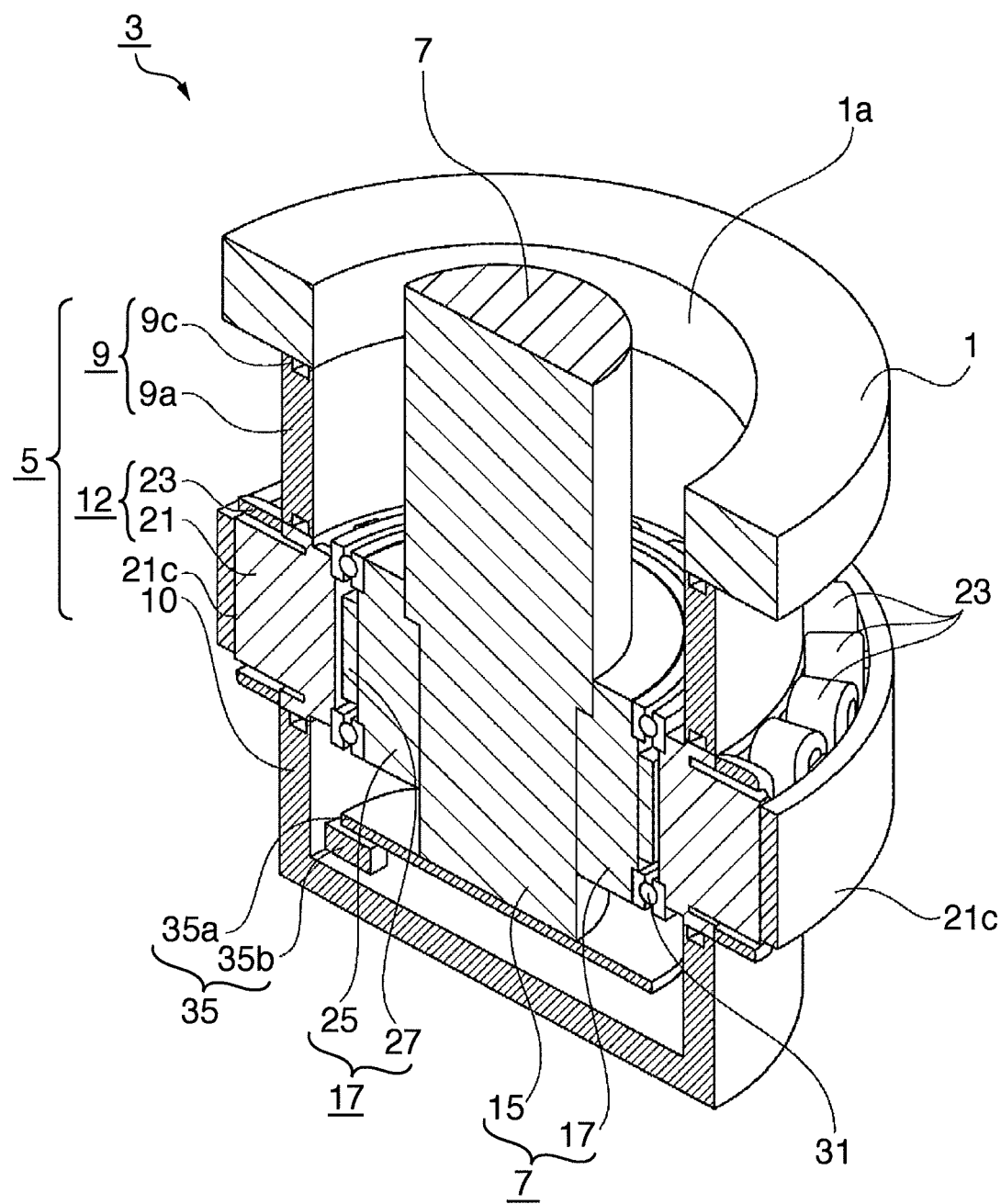
FIG. 1 is a sectional perspective view of a motor according to the first embodiment of the present invention.
Figure 2:
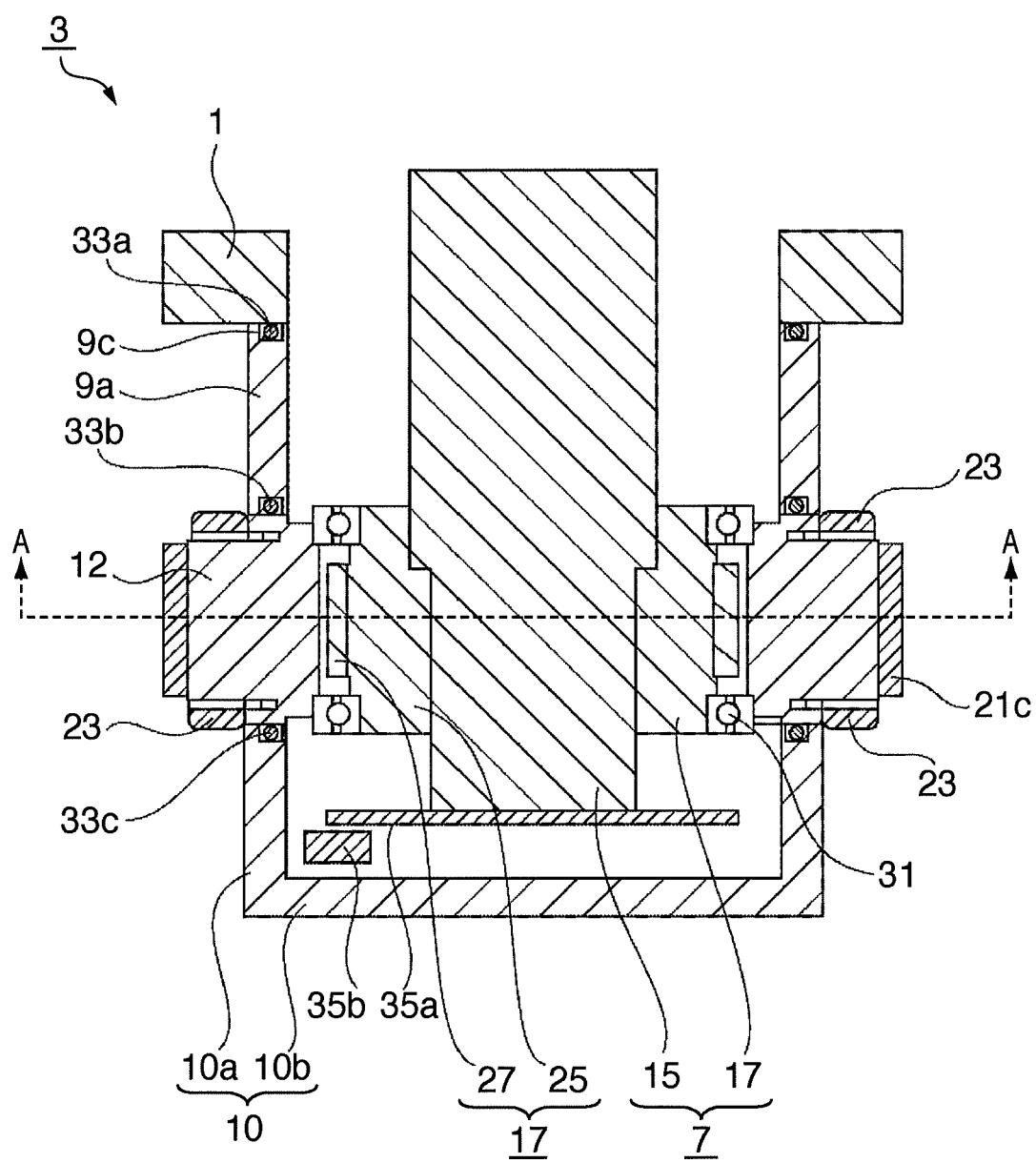
FIG. 2 is a longitudinal sectional view of the motor according to the first embodiment of the present invention.
Figure 3:
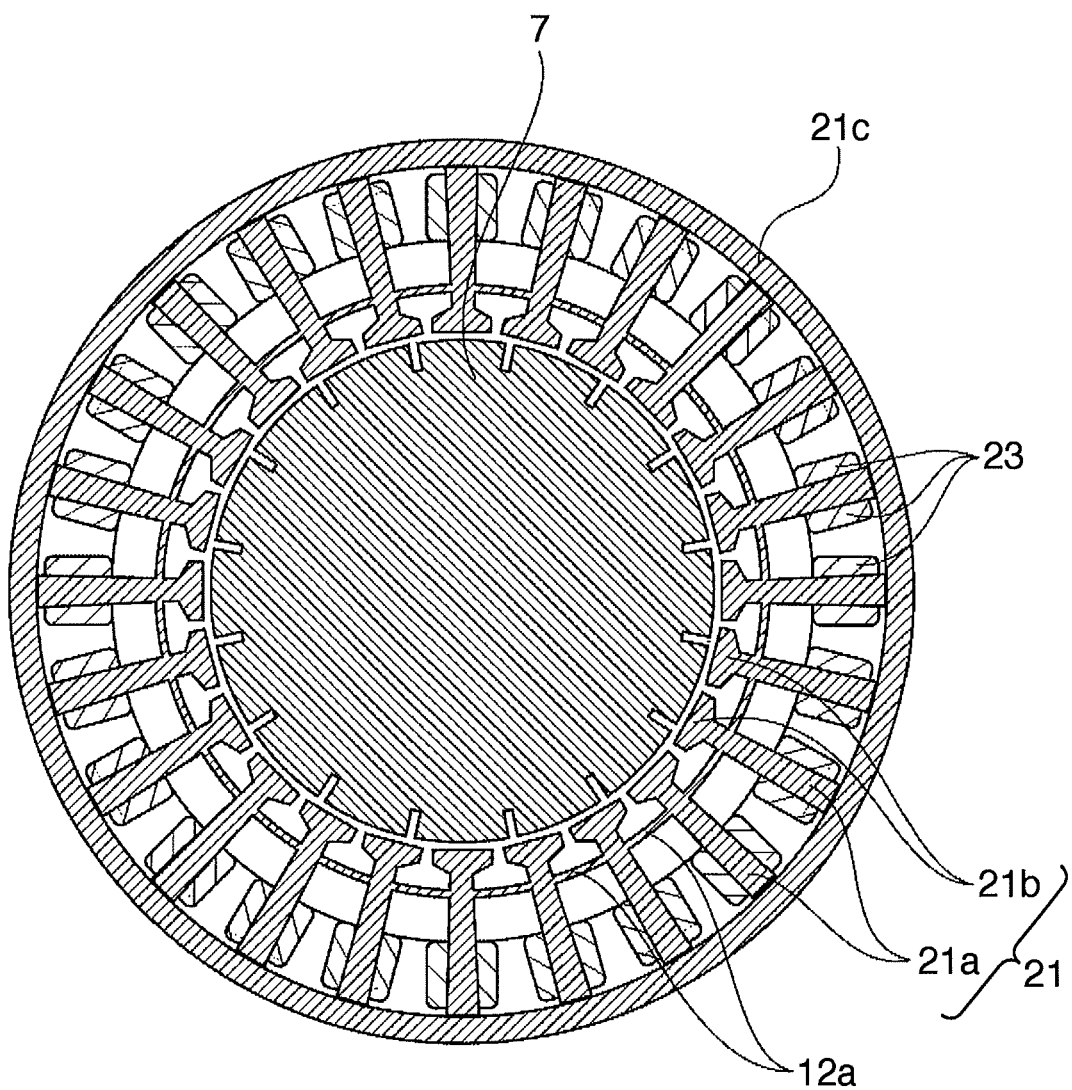
FIG. 3 is a sectional view taken along a line A-A in FIG. 2.

FIGS. 1 to 7 are views showing an actuator according to the first embodiment of the present invention. FIG. 1 is a sectional perspective view of a motor, FIG. 2 is a longitudinal sectional view of the motor, and FIG. 3 is a sectional view taken along a line A-A in FIG. 2. FIGS. 4A and 4B to 7 show arrangement examples in which the actuator according to this embodiment is applied to a substrate transport robot.

Note that some constituent elements are not shown in these drawings for the sake of avoiding complexity.

In the actuator (a motor 3) shown in FIGS. 1 and 2, a rotor 7 is supported by a motor casing 5 to be free to rotate. The motor casing (vacuum partition wall) 5 can be attached to a vacuum vessel 1 so as to insert the distal end of the rotor 7 into an opening 1a formed in the wall surface of the vacuum vessel 1.

While the motor casing 5 is attached to the vacuum vessel 1, the distal end of the rotor 7 can protrude into the vacuum vessel 1.

The motor casing (vacuum partition wall) 5 is an almost cylindrical closed-end vessel, the interior of which can be maintained in a vacuum atmosphere. The motor casing 5 includes, as its main constituent elements, a first housing 9 attached to the vacuum vessel 1, a stator 12 provided with coils 23, and a second housing 10 connected to the bottom portion of the stator 12.

Also, the rotor 7 includes a shaft 15 serving as an output shaft, and a magnet member 17 which surrounds the shaft 15 to be opposed to the stator 12. The rotation axis of the rotor 7 and the vertical central axis of the motor casing 5 coincide with each other.

Note that in this specification, the axial direction of the shaft 15 is defined as the vertical direction, the direction in which the vacuum vessel 1 is located is defined as the upward direction, and the direction in which the motor casing 5 is located is defined as the downward direction.

The motor casing 5 will be described first. The first housing 9 is attached to the surface of the vacuum vessel 1, which is on the lower side of the opening 1a formed in it, by a fastening member on the upper side of the motor casing 5, and includes a cylindrical upper wall portion 9a which forms part of the side surface of the motor casing 5. A groove 9c in which an O-ring 33a is to be fitted is formed at the upper end of the upper wall portion 9a, and is maintained airtight by sandwiching the O-ring 33a between the bottom surface of the vacuum vessel 1, which surrounds the opening 1a, and the upper end of the upper wall portion 9a. The upper wall portion 9a is airtightly connected to the upper portion of the stator 12 on the lower side of the motor casing 5, and an O-ring 33b is inserted in the connecting portion between the stator 12 and the second housing 10.

The stator 12 is an almost cylindrical member which is airtightly connected to the lower portion of the first housing 9, and includes a cylindrical sealing partition wall 12a and a plurality of stator teeth 21 which have an almost rectangular plate shape and are radially formed to penetrate through the sealing partition wall 12a, as shown in FIG. 3. The stator 12 is airtightly connected to the upper portion of the second housing 10 in the lower portion of the motor casing 5, and an O-ring 33c is inserted in the connecting portion between the stator 12 and the second housing 10.

Because the stator 12 is airtightly connected to the first housing 9 and second housing 10 on the upper and lower sides of the sealing partition wall 12a, the stator teeth 21 which penetrate through the sealing partition wall 12a are under the vacuum environment on their inner side and under the atmospheric environment on their outer side. The coils 23 are formed in the atmospheric-side portions of the stator teeth 21. The motor 3 in this embodiment includes 24 stator teeth 21, on each of which one coil 23 is formed, and therefore includes an equal number of coils 23 to the stator teeth 21.

Although FIG. 3 shows an arrangement example in which the coils 23 are 24 coils with three phases and eight poles and have 16 rotor-side poles, a known structure can be appropriately adopted as a combination of the coils 23 and the number of rotor-side poles. Also, although a polyester enamel wire with a diameter of 1.0 mm (φ1.0 PEW) is used as the conductive wire wound around the stator tooth 21 in this embodiment, a known conductive wire can be appropriately adopted.

The second housing 10 is an almost cylindrical closed-end member which is airtightly connected to the lower portion of the stator 12, and includes a cylindrical lower wall portion 10a which forms part of the side surface of the motor casing 5, and an almost disk-shaped bottom plate 10b which forms its bottom surface.

The rotor 7 will be described next. The shaft 15 is a main constituent element of the rotor 7, as mentioned above, and is supported to be free to rotate while at least its lower portion is inserted in the motor casing 5. The upper, distal end of the shaft 15 protrudes from the upper side of the motor casing 5 so that it can protrude into the vacuum vessel 1. The lower portion of the shaft 15 is coaxially fitted in the magnet member 17. The shaft 15 may be formed from a hollow tube-shaped member for inertia reduction.

The magnet member 17 is a main constituent element of the rotor 7, as mentioned above, and is fixed on the lower edge of the shaft 15 while the axis lines of the stator 12 and shaft 15 coincide with each other. The magnet member 17 in this embodiment includes an almost annular back yoke 25 fixed on the shaft 15, and a plurality of permanent magnets 27 which align themselves along the outer peripheral surface of the back yoke 25.

The back yoke 25 is a member which forms a flux path of the permanent magnets 27, and is made of a magnetic material typified by a silicon steel plate or ferrite. The back yoke 25 can have any shape as long as it can form a flux path, and may have, for example, a shape in which projections and grooves are formed in the inner or outer surface or that in which a plurality of holes are formed in it within the range in which this shape does not adversely affect the flux path.

The permanent magnets 27 include a plurality of segment permanent magnets magnetized such that a magnetic flux generated by them is oriented in the plate thickness direction. In this embodiment, 16 vertically elongated rectangular segment magnets are arrayed in a ring shape along the outer peripheral surface of the back yoke 25 so as to have alternate polarities. Also, to prevent cogging, the permanent magnets 27 more preferably have a fan-shaped cross-sectional shape in the plate thickness direction.

An arbitrary permanent magnet made of a magnetic material such as an Sm-, Nd-, or ferrite-based material can be adopted as the permanent magnet 27, as a matter of course. Note that the permanent magnets 27 are preferably attached to the back yoke 25 with a skew angle between them to suppress cogging. Moreover, the permanent magnets 27 may be directly attached to the shaft 15 without providing the magnet member 17 with the back yoke 25, as a matter of course.

Characteristic arrangements in this embodiment will be described in detail below. The stator 12 will be described in detail first. The stator 12 includes the sealing partition wall 12a, and the stator teeth 21 formed to penetrate through the sealing partition wall 12a, as mentioned above. The sealing partition wall 12a functions as a vacuum partition wall, and is integrated with the stator teeth 21. The thickness of the sealing partition wall 12a must allow a magnetic flux generated by the coils 23 to leak out to the rotor side, and is adjusted to about 0.5 to 2.0 mm in the motor 3.

The stator teeth 21 are members on which the coils 23 are formed by winding conductive wires around them. The stator tooth 21 includes a core portion 21a which has an almost rectangular plate shape and is formed to penetrate through the sealing partition wall 12a, and a core holder portion 21b which has an almost rectangular plate shape and is formed at the end of the core portion 21a on the inner side of the stator 12. Also, although the motor 3 in this embodiment includes an almost cylindrical outer peripheral yoke 21c at the end of the core portion 21a on the outer side of the stator 12, it can include no outer peripheral yoke 21c.

The core portions 21a are radially arranged at an equal angular interval upon matching their longitudinal directions with their axial directions so that the vicinities of their middle positions in the radial direction are almost perpendicularly inserted in the sealing partition wall 12a. That is, the core portion 21a has its one end disposed on the inner side (vacuum side) of the stator 12, and its other end disposed on the outer side (atmospheric side) of the stator 12.

The core holder portion 21b is obtained by forming, at the end of the core portion 21a on the inner side of the stator teeth 21, an almost plate-shaped structure that is formed by curving so as to be parallel to the outer peripheral surface of the magnet member 17. The coil 23 is formed by repeatedly winding a conductive wire around the atmospheric-side portion of the core portion 21a. Because the coil 23 is formed on the atmospheric side, an out-gas generated by the conductive wire of the coil 23 does not adversely affect the degree of vacuum on the inner side of the stator 12.

The stator 12 is made of a material which has a low iron loss, such as a silicon steel plate, ferrite, or permalloy. The stator 12 in this embodiment is formed from a member obtained by processing such a material into a predetermined shape. The stator 12 is more preferably formed by axially (vertically) stacking a large number of plate members made of a material as mentioned above, which has a low iron loss. The sealing partition wall 12a and the stator teeth 21 may be manufactured as separate bodies and assembled to form the stator 12. In this case, stator teeth are inserted into openings formed in a sealing partition wall, and are airtightly, firmly fixed by brazing or an adhesive.

Stator teeth on which coils are formed by winding conductive wires around them in advance are preferably inserted into the sealing partition wall and firmly fixed on it because this obviates the need to wind wires with narrow slits. The stator teeth are desirably made of a material with a magnetic permeability higher than the sealing partition wall. Alternatively, only the sealing partition wall may be made of a nonmagnetic material such as nonmagnetic stainless steel.

The motor 3 in this embodiment adopts a structure including the almost cylindrical outer peripheral yoke 21c which connects the outer ends of the stator teeth 21. The outer peripheral yoke 21c is firmly fixed by fastening using screws or by press fitting or welding while being in contact with the outer peripheral portion of the stator teeth 21. The strength of the stator can be enhanced by integrating it with a rib. Also, because the outer peripheral yoke 21c is made of the same material as the stator teeth 21, it can form a flux path on the outer peripheral side of each stator tooth 21 to guide magnetic lines of force generated by it to an adjacent stator tooth 21.

The outer peripheral yoke 21c is fixed on the stator teeth 21 so as not to cover the upper and lower portions of the coils 23, and the stator teeth 21 have gaps on their upper and lower sides, so the outer peripheral yoke 21c has a structure with high heat dissipation performance. That is, the air overheated in the vicinity of the coils 23 is discharged from the gap above the outer peripheral yoke 21c, and the external air flows into the outer peripheral yoke 21c from the gap on the upper side of the outer peripheral yoke 21c, thereby making it easy to generate convention. An opening may be additionally formed in the outer peripheral yoke 21c to further improve the heat dissipation performance.

A magnetic field generated by the coils 23 runs through the stator teeth 21 with a high magnetic permeability along a flux path defined in it. Hence, a magnetic field generated in the atmospheric-side portion of the stator 12 is guided to the interior (vacuum side) of the stator 12 upon running through the stator teeth 21. Also, because a strong flux path can be formed in a region along the outer peripheral surface of the magnet member 17 by the core holder portions 21b, a stronger magnetic field can be formed in the vicinity of the outer peripheral surface of the magnet member 17.

That is, a magnetic field generated by the coils 23 on the atmospheric side is guided to the vacuum side upon running through the stator teeth 21 on which the coils 23 are formed, thereby making it possible to form a strong magnetic field at the ends of the stator teeth 21, which are in proximity to the magnet member 17 (permanent magnets 27).

Also, when the stator teeth 21 are made of a material with a magnetic permeability higher than the sealing partition wall 12a, the number of magnetic lines of force which leak to the sealing partition wall 12a can be decreased, thus obtaining a motor with a higher power and efficiency.

Note that when the stator 12 is formed by axially (vertically) stacking a large number of plate members, it preferably has a sealing structure by solidifying a resin or ceramics impregnated into the gaps between these plate members (impregnation treatment). By impregnating, for example, the gaps between the individual conductive wires with, for example, a resin in this way, the stator 12 can function as a vacuum partition wall, and the surface areas of the coils 23 exposed to the vacuum region can be reduced to suppress discharge of an out-gas.

In this embodiment, PPS (polyphenylene sulfide) resin used in packaging, for example, a semiconductor element is employed. An impregnation treatment can be performed by heating, melting, and supplying PPS pellets (grain-like source materials) into the gaps of the stator 12 by means of a capillary phenomenon, and cooling them, while they surround the stator 12.

The positions and effects of bearings 31 will be described next. The bearings 31 are inserted in the gap between the outer peripheral portion of the magnet member 17 and the inner peripheral portion of the stator teeth 21. That is, the outer peripheral surfaces of two bearings 31 abut against the upper and lower edges, respectively, of the inner peripheral surface of the stator teeth 21 (core holder portions 21b) formed to overhang on the inner side of the stator 12, and the inner peripheral surfaces of the two bearings 31 abut against the upper and lower edges, respectively, of the outer peripheral surface of the magnet member 17.

In this manner, in the motor 3 according to this embodiment, the position of the rotor 7 relative to the stator 12 can be directly determined. This makes it possible to ensure high coaxial accuracy between the stator 12 and the rotor 7. That is, it is possible to assemble the inner peripheral surface of the stator teeth 21 and the outer peripheral surface of the magnet member 17 with extremely high distance accuracy between them, and to bring the inner peripheral surface of the stator teeth 21 and the outer peripheral surface of the magnet member 17 close to each other. It is therefore possible to enhance the efficiency of the motor 3, reduce torque ripples, and improve the assembly performance.

Also, the rotor 7 can be supported only by two bearings 31. That is, the rotor 7 can have an arrangement in which it comes into contact with other members only in the lower portion of the shaft 15 and includes no bearing in its portion close to the vacuum vessel 1. In this case, even if a particle is generated in the bearing 31, it hardly reaches the interior of the vacuum vessel 1 upon passing through the opening 1a on its upper side.

Moreover, because both the bearings 31 are adjacent to the magnet member 17 (permanent magnets 27), a magnetic particle can be removed upon adhering onto the magnet member 17 even if it is generated. The bearing 31 may be disposed on only one of the upper and lower edges of the outer peripheral surface of the magnet member 17, as a matter of course. In this case as well, a magnetic particle can be removed upon adhering onto the magnet member 17. However, the position of the bearing 31 is not limited to this.

Note that substrate transport robots R1 and R2 which use the motor 3 shown in FIGS. 4A and 4B to 7 will be described later as an Example.

Second Embodiment

Figure 8:
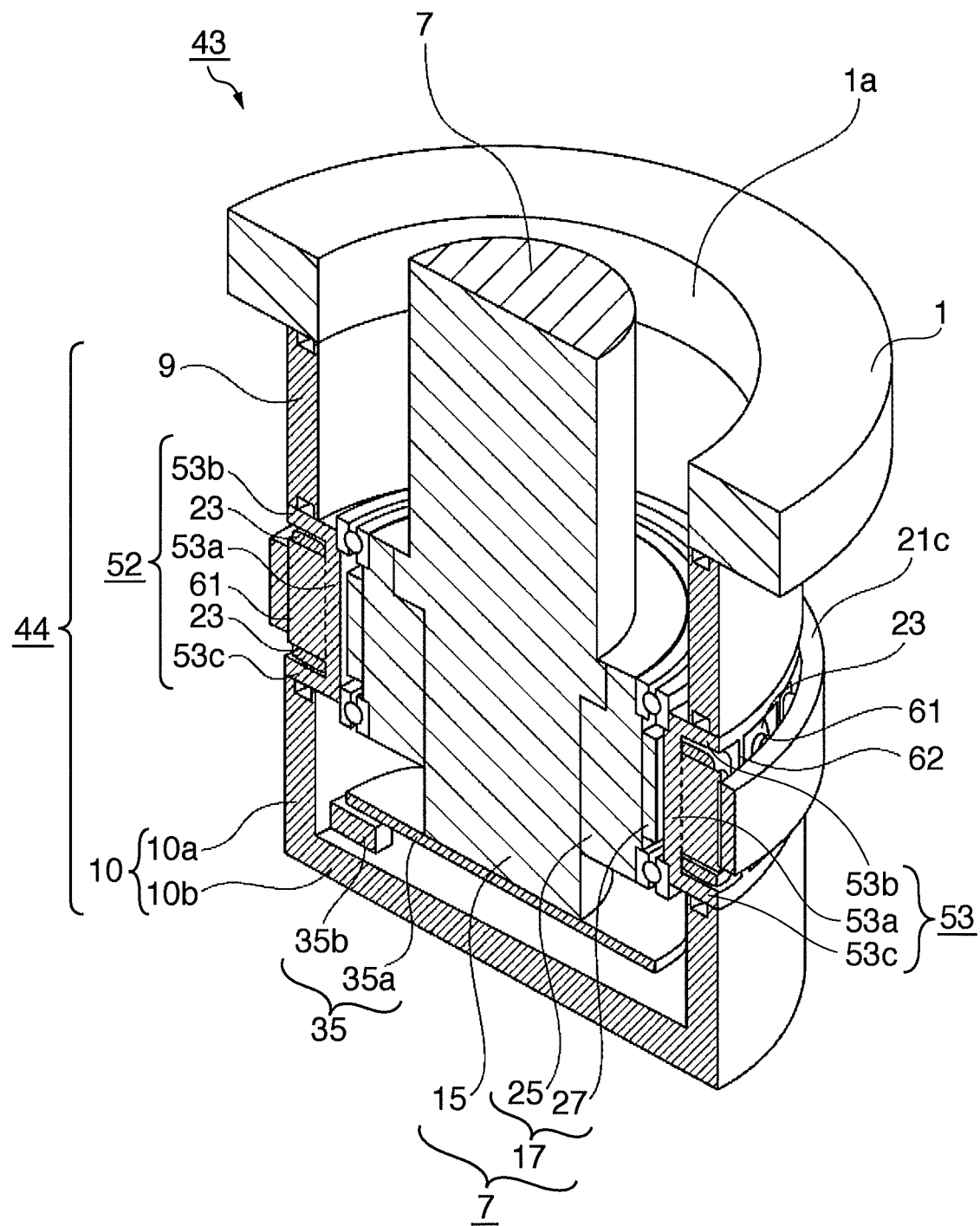
FIG. 8 is a sectional perspective view of a motor according to the second embodiment of the present invention.
Figure 9:
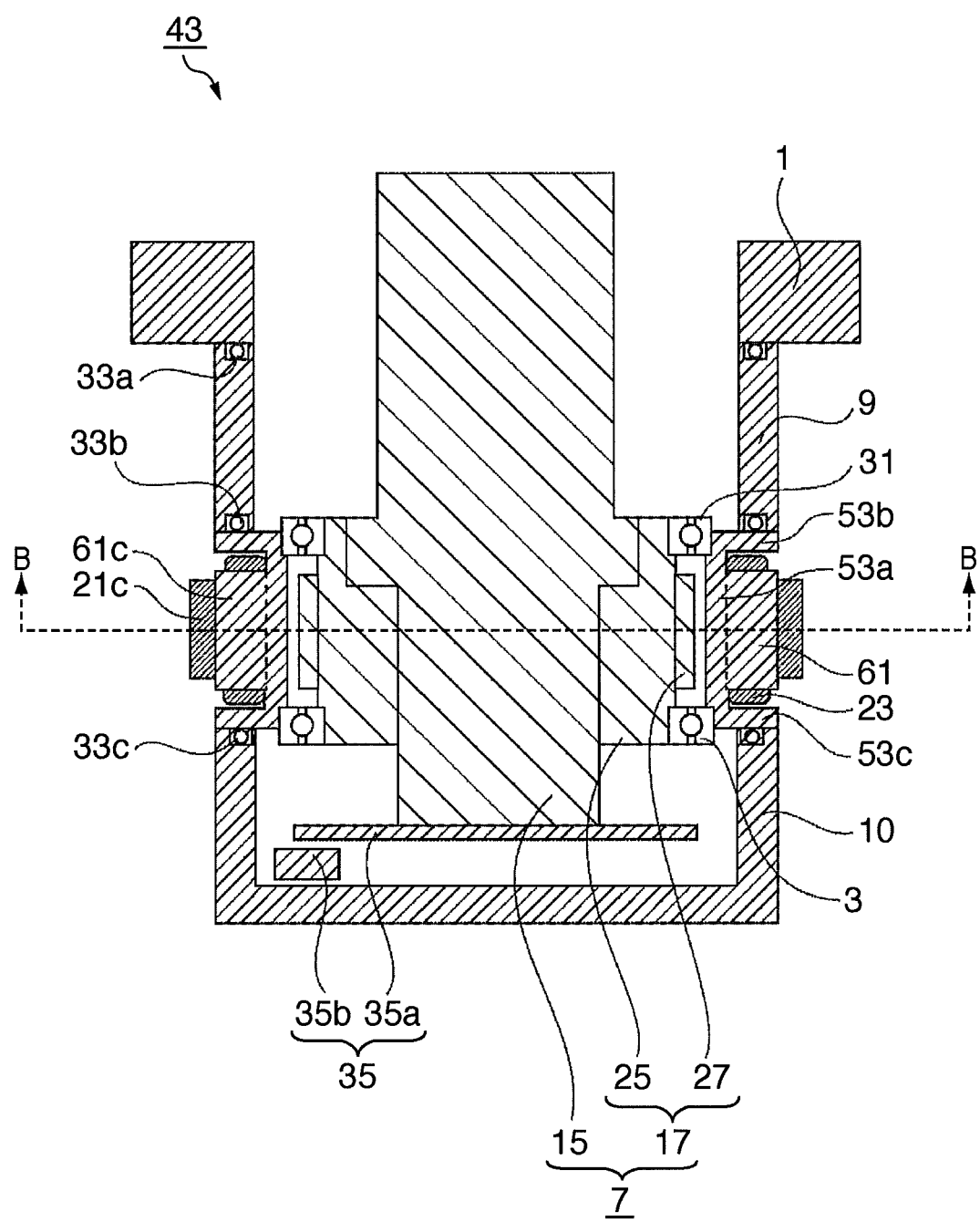
FIG. 9 is a longitudinal sectional view of the motor according to the second embodiment of the present invention.
Figure 12:
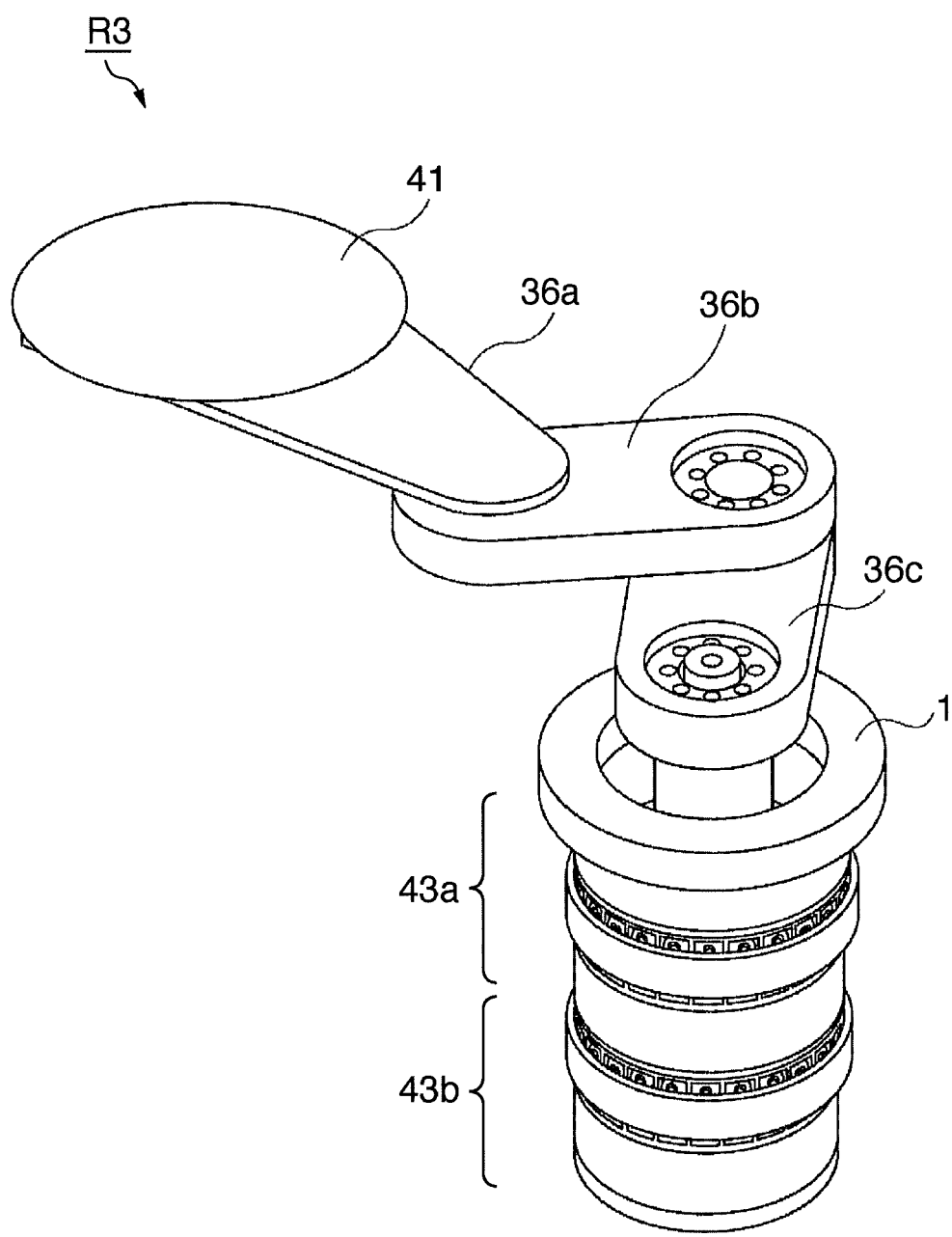
FIG. 12 shows an arrangement example (perspective view) of a transport robot to which the motor according to the second embodiment of the present invention is applied.
Figure 13:
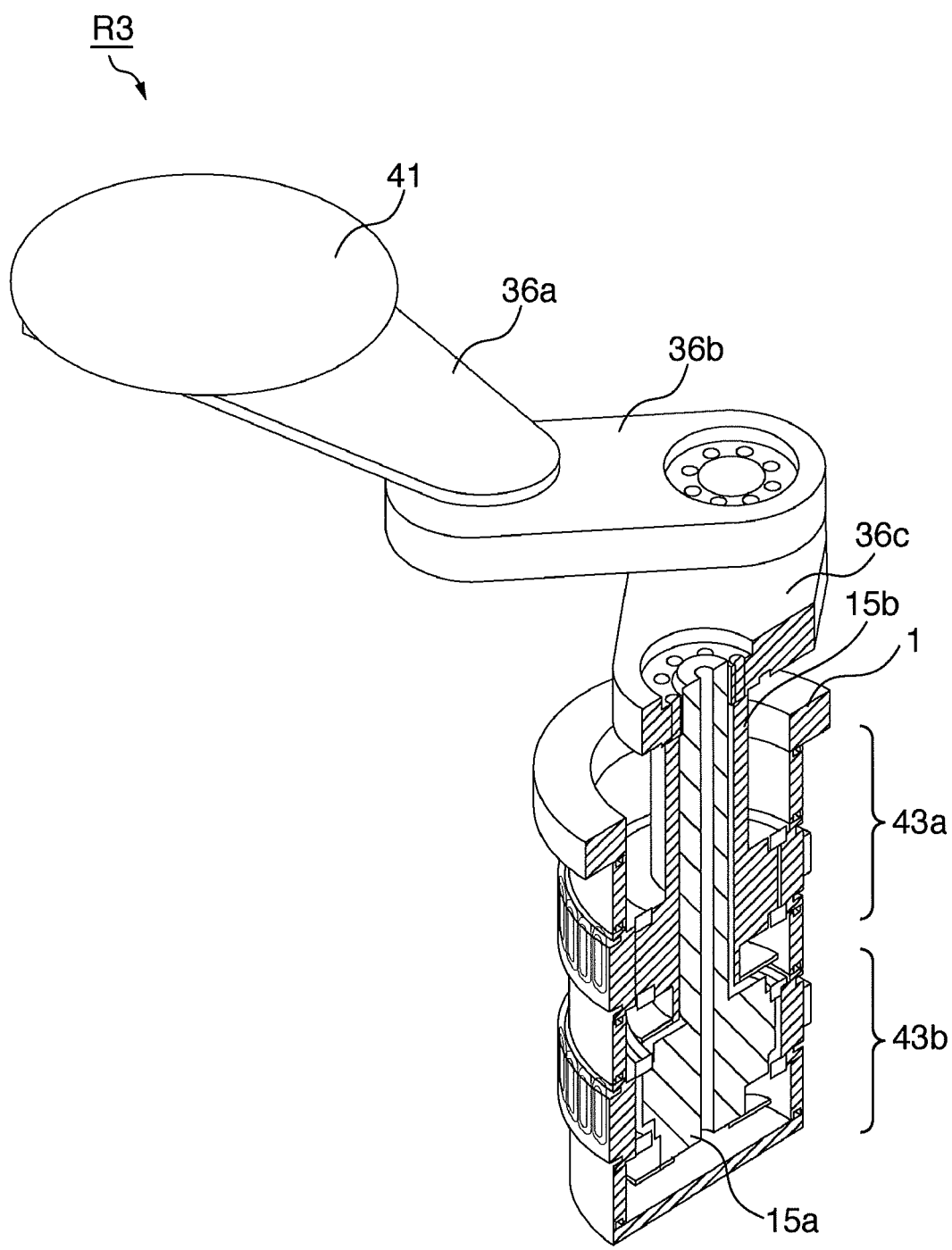
FIG. 13 shows an arrangement example (partial sectional view) of the transport robot to which the motor according to the second embodiment of the present invention is applied.
Figure 14:
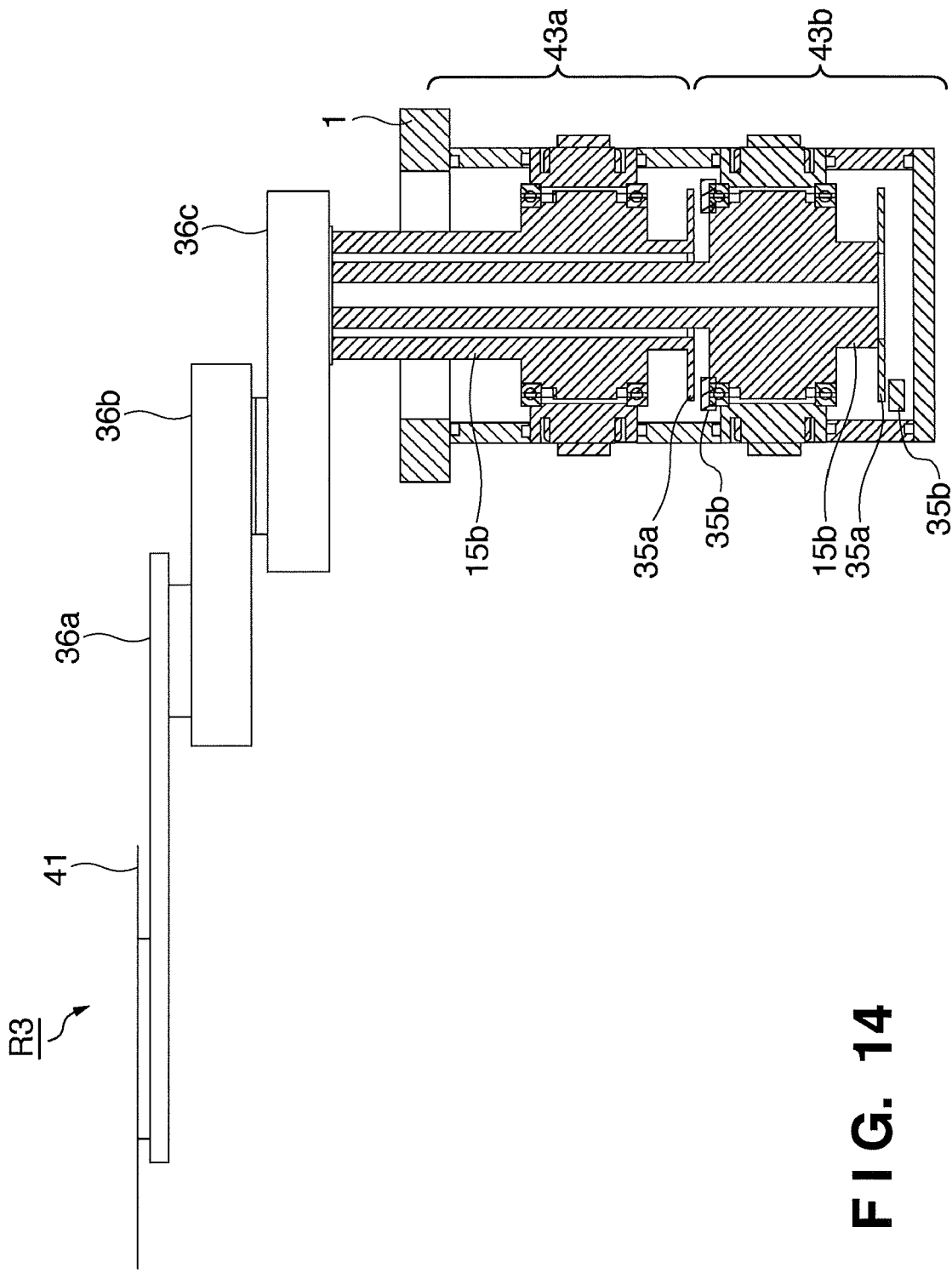
FIG. 14 shows an arrangement example (partial sectional view) of the transport robot to which the motor according to the second embodiment of the present invention is applied.

FIGS. 8 to 10 are views showing an actuator (a motor 43) according to the second embodiment of the present invention. FIG. 8 is a sectional perspective view of the motor, FIG. 9 is a longitudinal sectional view of the motor, and FIG. 10 is a sectional view taken along a line B-B in FIG. 9. FIGS. 12 to 14 show arrangement examples in which the actuator according to this embodiment is applied to a substrate transport robot. Note that some constituent elements are not shown in these drawings for the sake of avoiding complexity. Note also that the same reference numerals as in the first embodiment denote the same members, arrangements, etc. in the second embodiment, and a detailed description thereof will not be given.

The actuator (motor 43) according to this embodiment has a large difference in arrangement of a stator 52 from the motor 3 according to the first embodiment. The stator 52 is an almost cylindrical member which is airtightly connected to the lower portion of a first housing 9, and includes a sealing partition wall 53, and a plurality of stator teeth 61 which have an almost rectangular plate shape and are radially formed to extend outwards from the outer wall surface of the sealing partition wall 53, as shown in FIG. 8.

The sealing partition wall 53 functions as a partition wall which maintains a vacuum, has a thickness of about 0.5 to 2.0 mm, and is integrated with the stator teeth 61. Also, the sealing partition wall 53 includes a cylindrical partition wall portion 53a, and ring-shaped flange portions 53b and 53c formed in the upper and lower portions, respectively, of the partition wall portion 53a. The partition wall portion 53a is formed to have a diameter which allows it to be connected to the inner diameter-side portions of the flange portions 53b and 53c.

The upper portion of the flange portion 53b and the lower portion of the flange portion 53c are connected to the first housing 9 and a second housing 10, respectively. An O-ring 33b for maintaining airtightness is interposed between the flange portion 53b and the first housing 9, and an O-ring 33c is interposed between the flange portion 53c and the second housing 10.

Also, the flange portion 53b according to this embodiment is formed such that its edge on the outer diameter side has nearly the same diameter as the outer peripheral surfaces of the first housing 9 and second housing 10. That is, the flange portion 53b overhangs such that the inner peripheral surface of the partition wall portion 53a comes close to the outer peripheral surface of a rotor 7.

Stator teeth 61 are members on which coils 23 are formed by winding conductive wires around them, and are radially arranged at an equal angular interval upon matching their longitudinal directions with their axial directions so that their inner ends are almost perpendicularly connected to the partition wall portion 53a. The outer edge of the stator teeth 61 is formed to have nearly the same diameter as the outer peripheral surfaces of the flange portion 53b on the outer diameter side.

Hence, the coils 23 formed on the stator teeth 61 are disposed on the outer side (atmospheric side) of the sealing partition wall 53 so as not to protrude from the outer peripheral surface of a motor casing 44. Because the coil 23 is formed on the atmospheric side, an out-gas generated by the conductive wire of the coil 23 does not adversely affect the degree of vacuum on the inner side of a stator 12. Also, because the coils 23 have no portions projecting from the outer peripheral surface of the motor casing 44, space-saving can be achieved.

A rib 62 is formed between the upper and lower flange portions 53b and 53c to be integrated with the stator 52. The rib 62 is a plate-shaped member formed to extend parallel to the stator teeth 61, and can increase the rigidity of the stator

52. That is, a stress acting on the partition wall portion 53*a* can be reduced, thus forming the partition wall portion 53*a* to be thinner. A stator including no rib 62 may be used, as a matter of course.

Also, a slit 54 is formed on the inner side of the partition wall portion 53*a* along the axis line of the stator 52, as shown in FIG. 10. The slit 54 is a cut formed outwards from the inner surface of the partition wall portion 53*a* so as to leave a margin of about 0.3 to 3.0 mm for the thickness of the partition wall portion 53*a*, and is formed on the inner side of the partition wall portion 53*a* at the intermediate position of each stator tooth 61. The stator 52 can also include no slits 54.

A magnetic field generated by the coils 23 runs through the stator teeth 61 with a high magnetic permeability along a flux path defined in it. Hence, a magnetic field generated in the atmospheric-side portion of the stator 52 is guided to the interior (vacuum side) of the stator 52 upon running through the stator teeth 21.

In a thin portion in which the slit 54 is formed, a magnetic field generated by each coil 23 easily saturates and therefore can efficiently act on a magnet member 17. In other words, by longitudinally separating the partition wall portion 53*a* by the slits 54, a flux path can be formed along the outer peripheral surface of the magnet member 17, thus forming a stronger magnetic field in the vicinity of the outer peripheral surface of the magnet member 17. That is, the portions of the partition wall portion, which are separated by the slits 54, correspond to core holders. Slits may be formed in the partition wall portion 53*a* to completely cut it off, and the slit gaps may be filled with a sealing member such as a resin or an elastomer, as a matter of course.

The stator 52 is made of a material which has low iron loss, such as a silicon steel plate, ferrite, or permalloy, like the stator 12. The stator 52 is more preferably formed by axially (vertically) stacking a large number of plate members made of such a material.

The sealing partition wall 53 and the stator teeth 61 may be manufactured as separate bodies and assembled to form the stator 52. In this case, openings into which the ends of stator teeth are to be inserted are provided in a partition wall portion, and the stator teeth are desirably made of a material with a magnetic permeability higher than the partition wall portion. In this manner, by manufacturing a sealing partition wall and stator teeth as separate members and thereupon assembling them, the number of magnetic lines of force which leak to the sealing partition wall 12*a* can be decreased, thus obtaining a motor with a higher power and efficiency.

Figure 11:
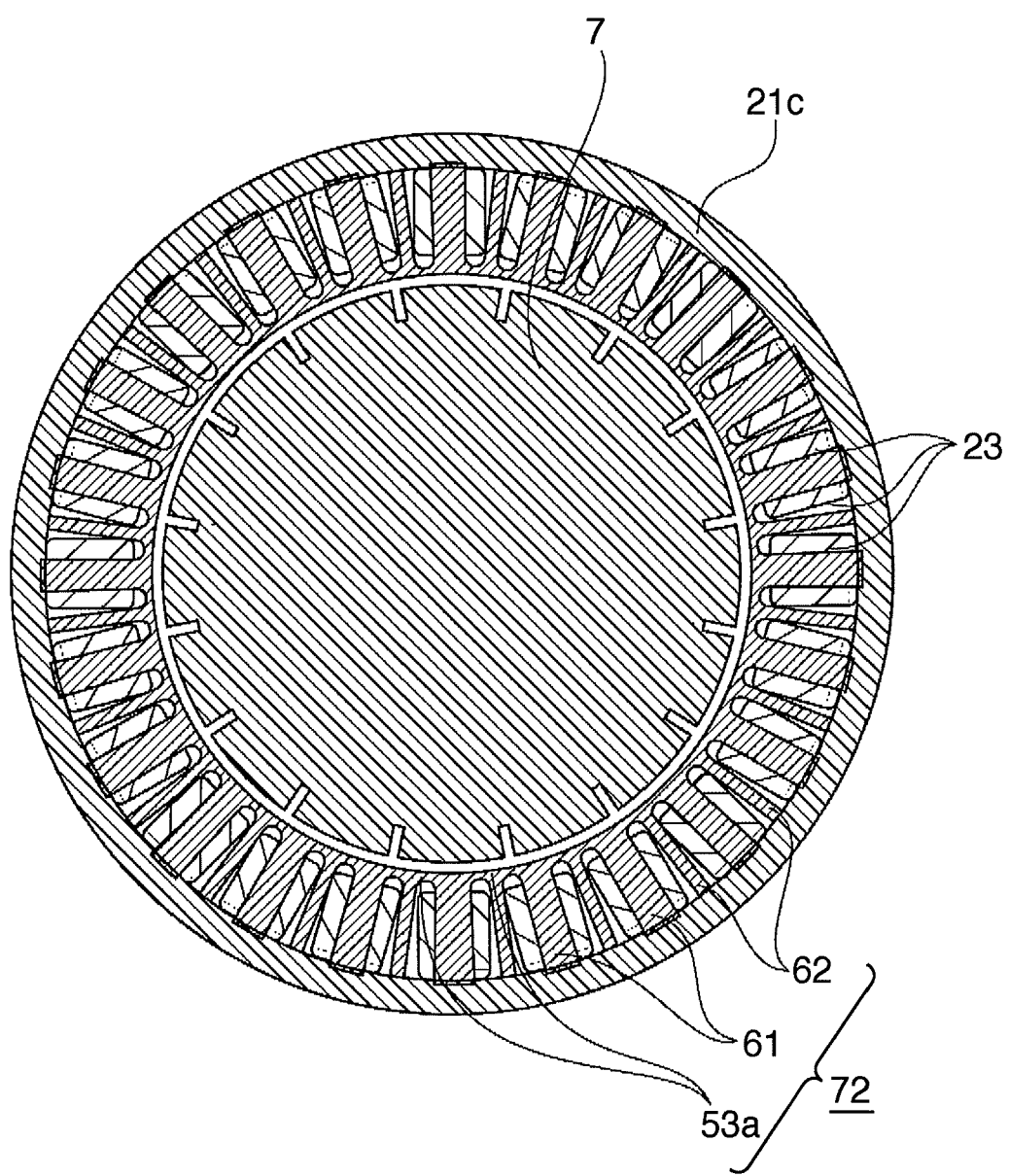
FIG. 11 shows another arrangement example (a sectional view taken along a line B-B in FIG. 9) of a stator according to the second embodiment of the present invention.

FIG. 11 shows another arrangement example (sectional view) of the stator, which is applicable to this embodiment. FIG. 11 is a sectional view taken along a line B-B in FIG. 9. A stator 72 shown in FIG. 11 is different from the stator 52 in that in the former no slit is formed in its inner surface opposed to the rotor 7 and the partition wall portion 53*a* is formed thin. Because the stator 72 includes no slit 54 formed in it, it can lower the manufacturing cost.

Example

A substrate transport robot formed using a motor 3 will be described with reference to FIGS. 4A and 4B to 7. A direct-drive substrate transport robot in which the horizontal substrate support position can be changed in a vacuum vessel 1 in accordance with the rotation angle of a shaft 15 can be formed by attaching, to the distal end of the shaft 15, a substrate mounting member (arm) on which a substrate, for example, can be mounted.

Arrangement examples of a one-axis substrate transport robot R1 to which the motor 3 is applied will be described first with reference to FIGS. 4A and 4B. It is preferable to connect a motor casing 5 and the vacuum vessel 1 to each other via a vertically expandable bellows pipe 38, and provide the atmospheric side with a known vertical moving mechanism 37 which adjusts the level position of the motor casing 5. With this arrangement, the distal end of the shaft 15 can rotate and vertical move. Thus, the substrate transport robot R1 which horizontally and vertically transports a substrate in the vacuum vessel 1 can be formed by attaching, to the distal end of the shaft 15, an arm 36 on which a substrate 41 can be mounted.

Note that the motor 3 includes a known servo device which controls the rotation angle of the shaft 15. The servo device includes an encoder (a disk and a read head) which monitors the rotation angle and rotation velocity of the shaft 15, and a power supply (not shown) which controls power to be supplied to a conductive wire which forms a coil (stator coil). The servo device can control the rotation speed and rotation angle of the shaft 15 by controlling a current flowing through the coil supplied with power, based on a rotation angle signal for the shaft 15, which is input from the encoder. That is, the use of the motor 3 as a power source for the substrate transport robot R1 allows control of the arm displacement velocity and position.

A motor 43 or a motor 303 (to be described later) can also be used in place of the motor 3, as a matter of course.

Figure 5:
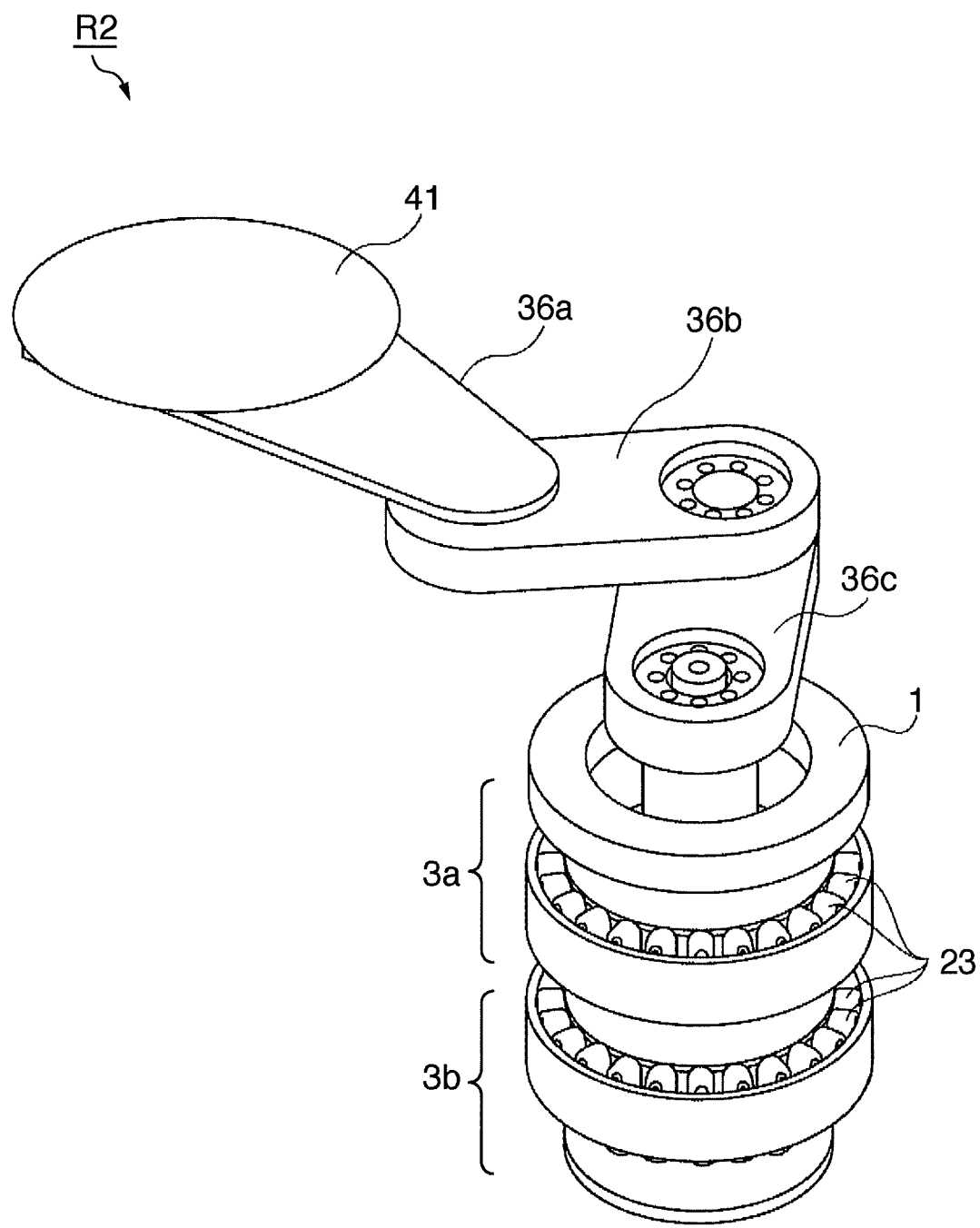
FIG. 5 shows an arrangement example (perspective view) of a transport robot (two-axis) to which the motor according to the first embodiment of the present invention is applied.
Figure 6:
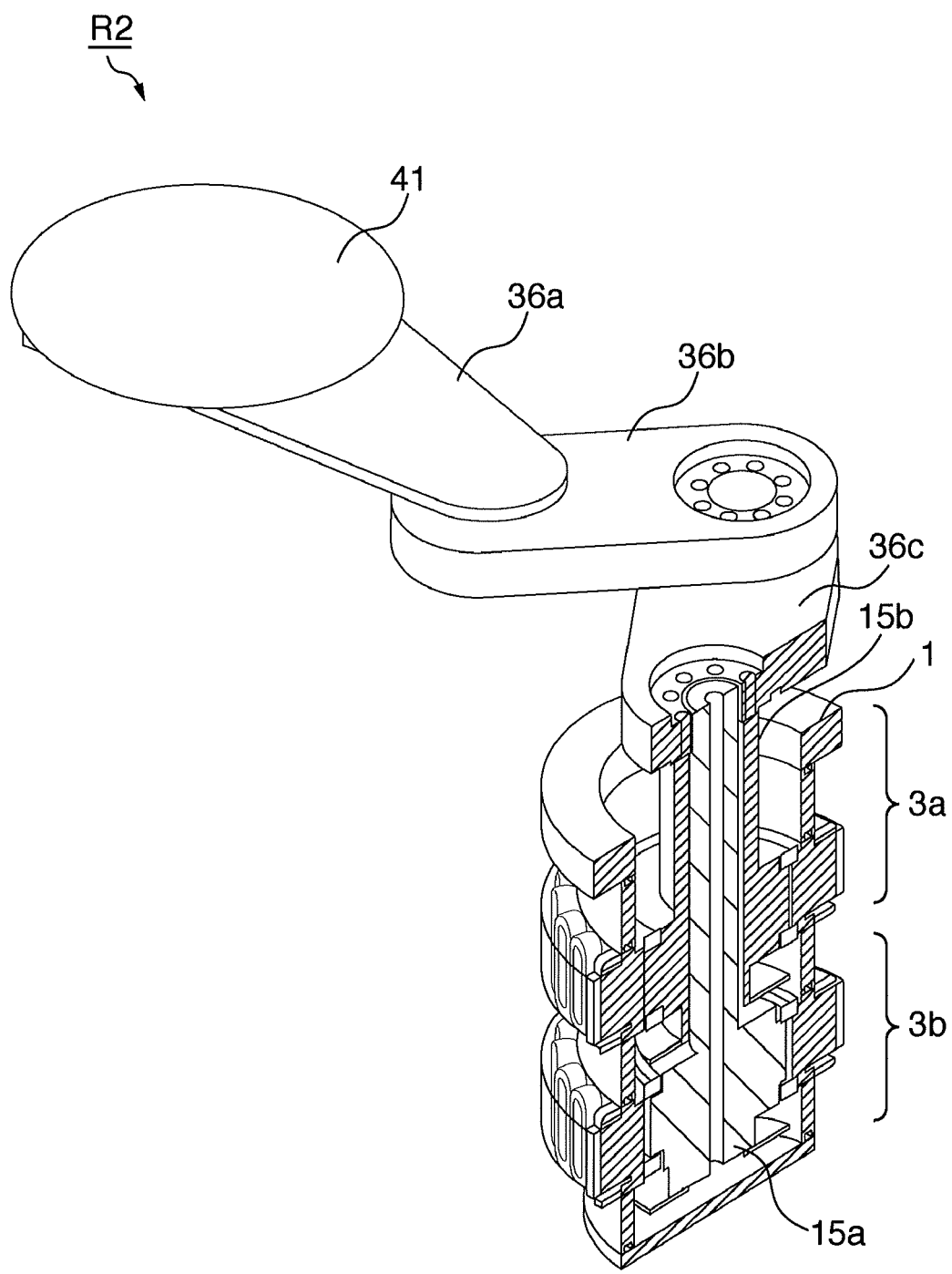
FIG. 6 shows an arrangement example (partial sectional view) of the transport robot (two-axis) to which the motor according to the first embodiment of the present invention is applied.
Figure 7:
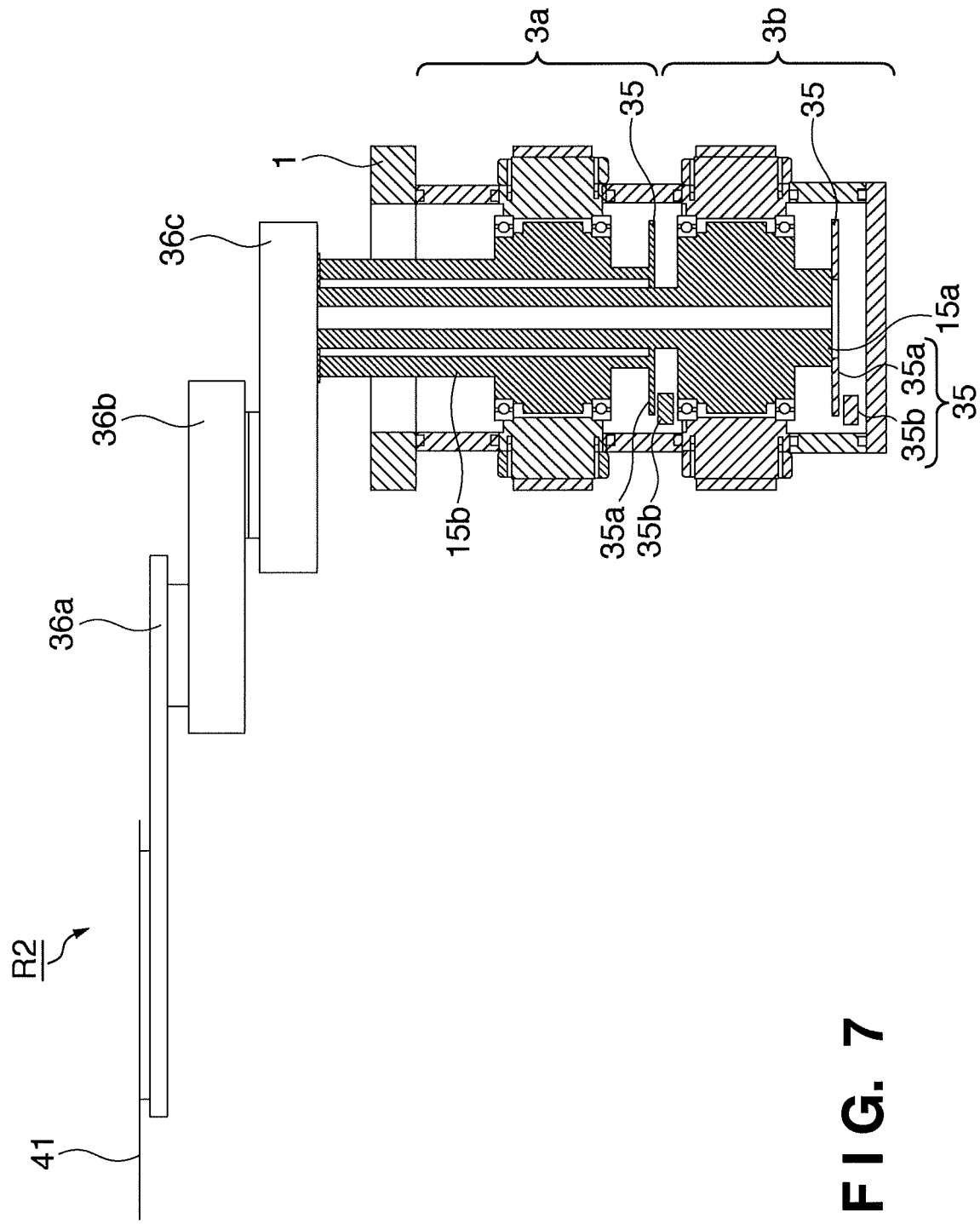
FIG. 7 shows an arrangement example (partial sectional view) of the transport robot (two-axis) to which the motor according to the first embodiment of the present invention is applied.

Arrangement examples of a two-axis substrate transport robot R2 to which the motor 3 is applied will be described next with reference to FIGS. 5 to 7. FIG. 5 shows an arrangement example (perspective view) of the transport robot to which the motor is applied, FIG. 6 shows an arrangement example (partial sectional view) of the transport robot to which the motor is applied, and FIG. 7 shows an arrangement example (partial sectional view) of the transport robot to which the motor is applied.

In the substrate transport robot R2, two vertically stacked motors 3*a* and 3*b* have the same arrangement as the motor 3 mentioned above. Also, an outer shaft 15*b* which is a shaft of the upper motor 3*a*, and an inner shaft 15*a* which is a shaft of the lower motor 3*b* are coaxially disposed to be independently controllable in rotation.

The outer shaft 15*b* is connected to an arm 36*c*, and the inner shaft 15*a* is connected to the arm 36*c* so as to pivot in synchronism with an arm 36*b* via a belt (not shown) suspended in the arm 36*c*. Therefore, movement of an arm 36*a* on which a substrate 41 is mounted, in the front-to-back direction and rotation direction (horizontal direction), can be controlled by controlling rotation of the motors 3*a* and 3*b*. Note that the arm portion has an arrangement known as a general scalar arm.

Figure 4A:
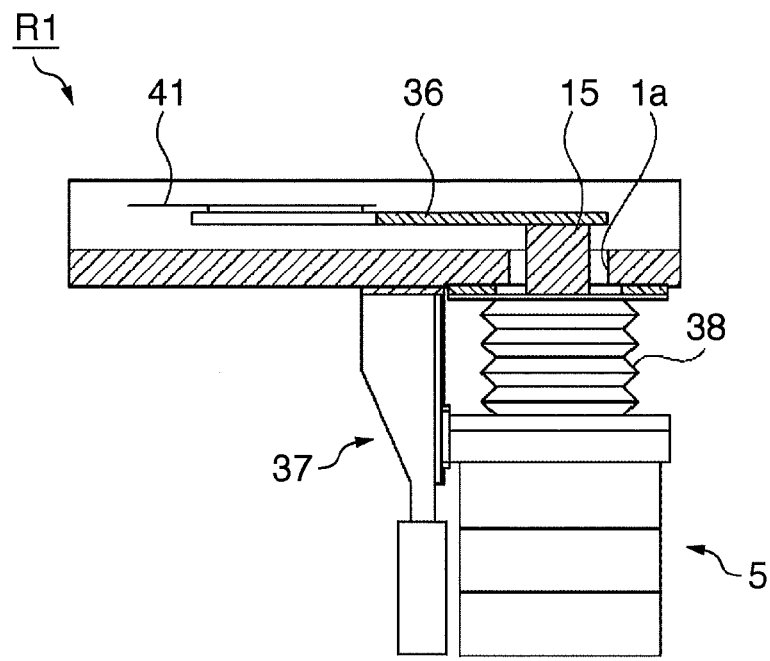
FIGS. 4A and 4B show arrangement examples (including a perspective view) of a transport robot (one-axis) to which the motor according to the first embodiment of the present invention is applied.
Figure 4B:
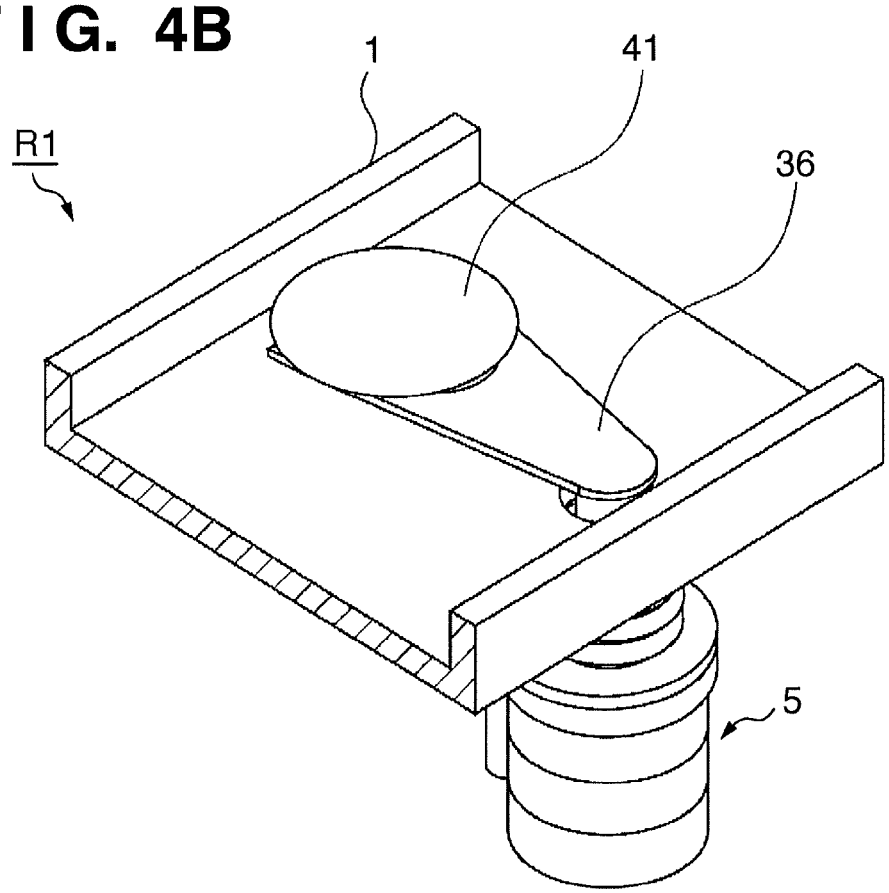

It is preferable to connect a motor casing of the motor 3*a* and the vacuum vessel 1 to each other via a vertically expandable bellows pipe (not shown), and provide the atmospheric-side portion of the motor casing with a known vertical moving mechanism which adjusts the level positions of the motors 3*a* and 3*b*, as in the substrate transport robot R1 shown in FIGS. 4A and 4B. With this arrangement, the arm 36*a* can be controlled to move horizontally and vertically. Thus, a substrate transport robot which horizontally and vertically transports a substrate in the vacuum vessel 1 can be formed.

FIGS. 12 to 14 show arrangement examples of a substrate transport robot R3 to which the motor 43 is applied. The substrate transport robot R3 is formed by vertically connecting two motors 43, that is, 43*a* and 43*b* to each other. In the substrate transport robot R3, the two vertically stacked motors 43a and 43b have the same arrangement as the motor 43 mentioned above. Also, an outer shaft 15b which is a shaft of the upper motor 43a, and an inner shaft 15a which is a shaft of the lower motor 43b are coaxially disposed to be independently controllable in rotation. Other arrangements of the substrate transport robot R3 are almost the same as those of the substrate transport robot R2 mentioned above.

Third Embodiment

Figure 15:
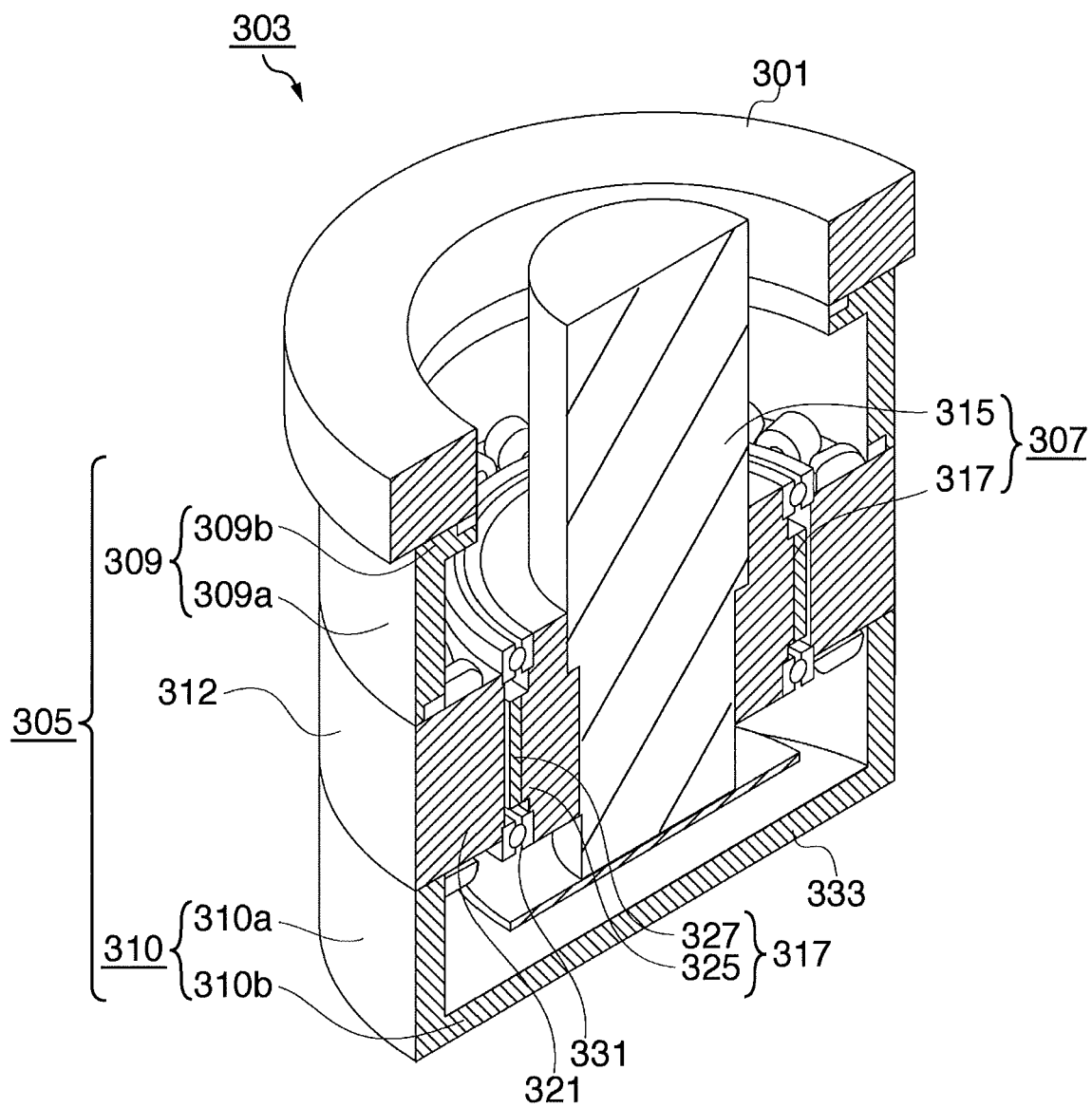
FIG. 15 is a sectional perspective view of a motor according to the third embodiment of the present invention.
Figure 16:
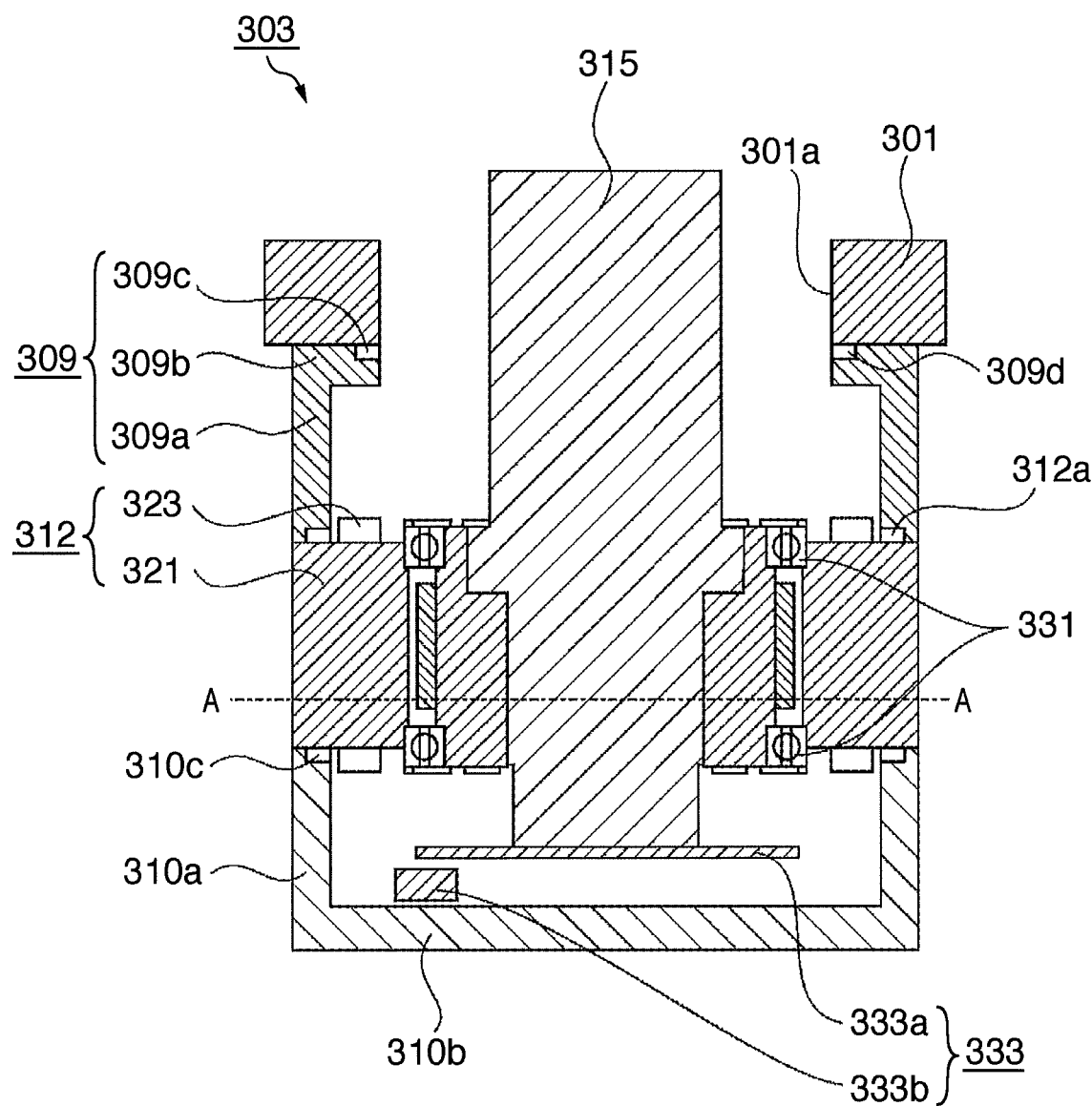
FIG. 16 is a longitudinal sectional view of the motor according to the third embodiment of the present invention.
Figure 17:
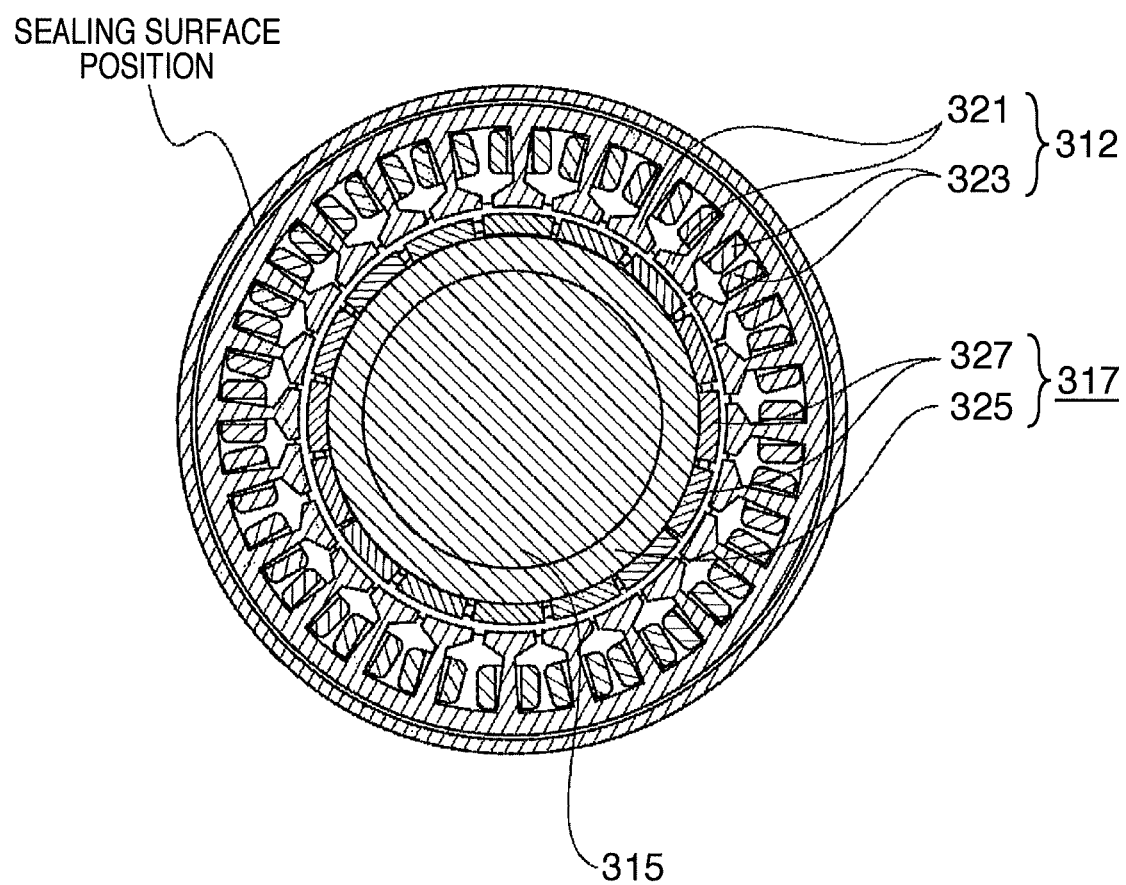
FIG. 17 is a sectional view taken along a line A-A in FIG. 16.
Figure 18:
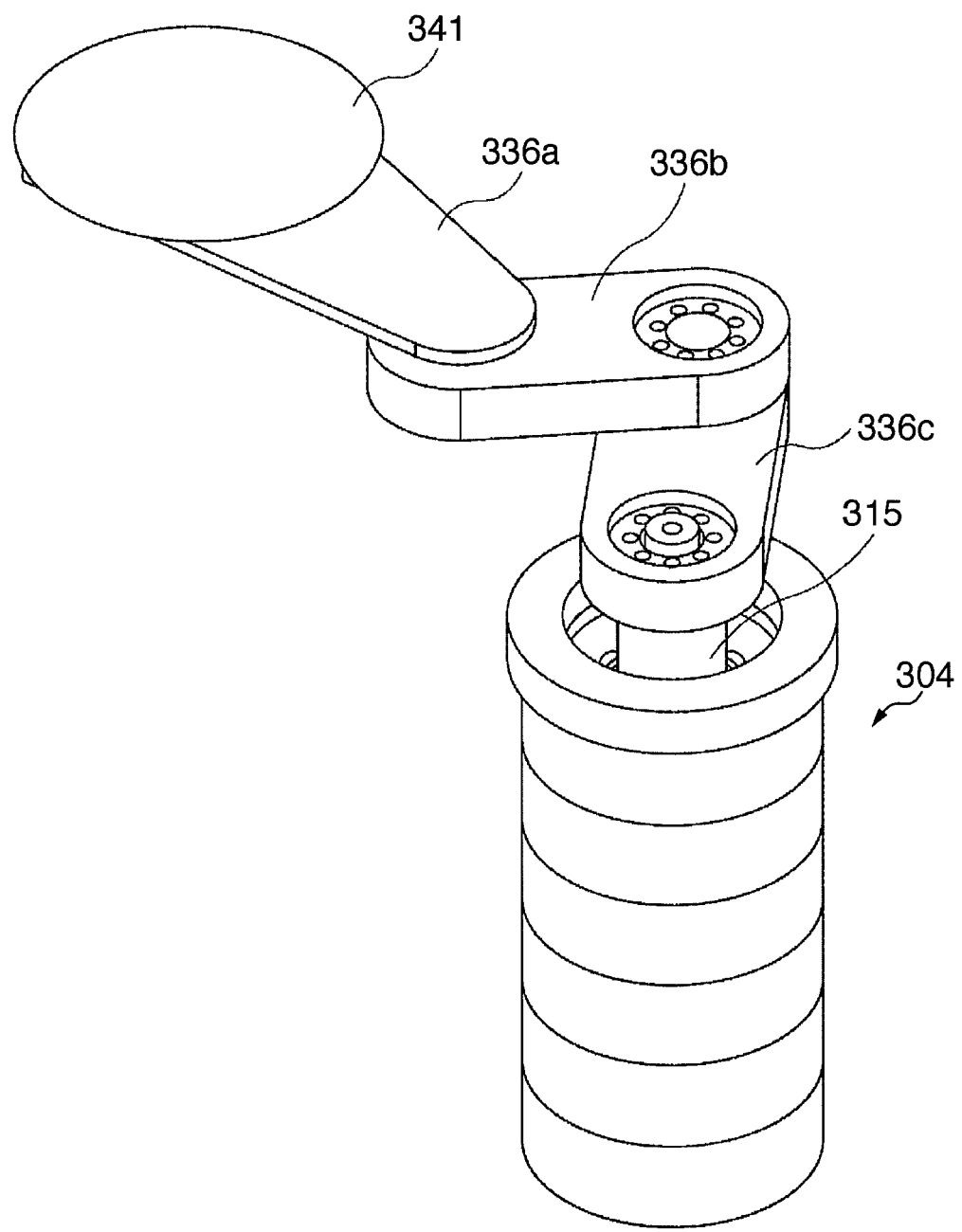
FIG. 18 shows an arrangement example (perspective view) of a transport robot to which the motor according to the third embodiment of the present invention is applied.
Figure 19:
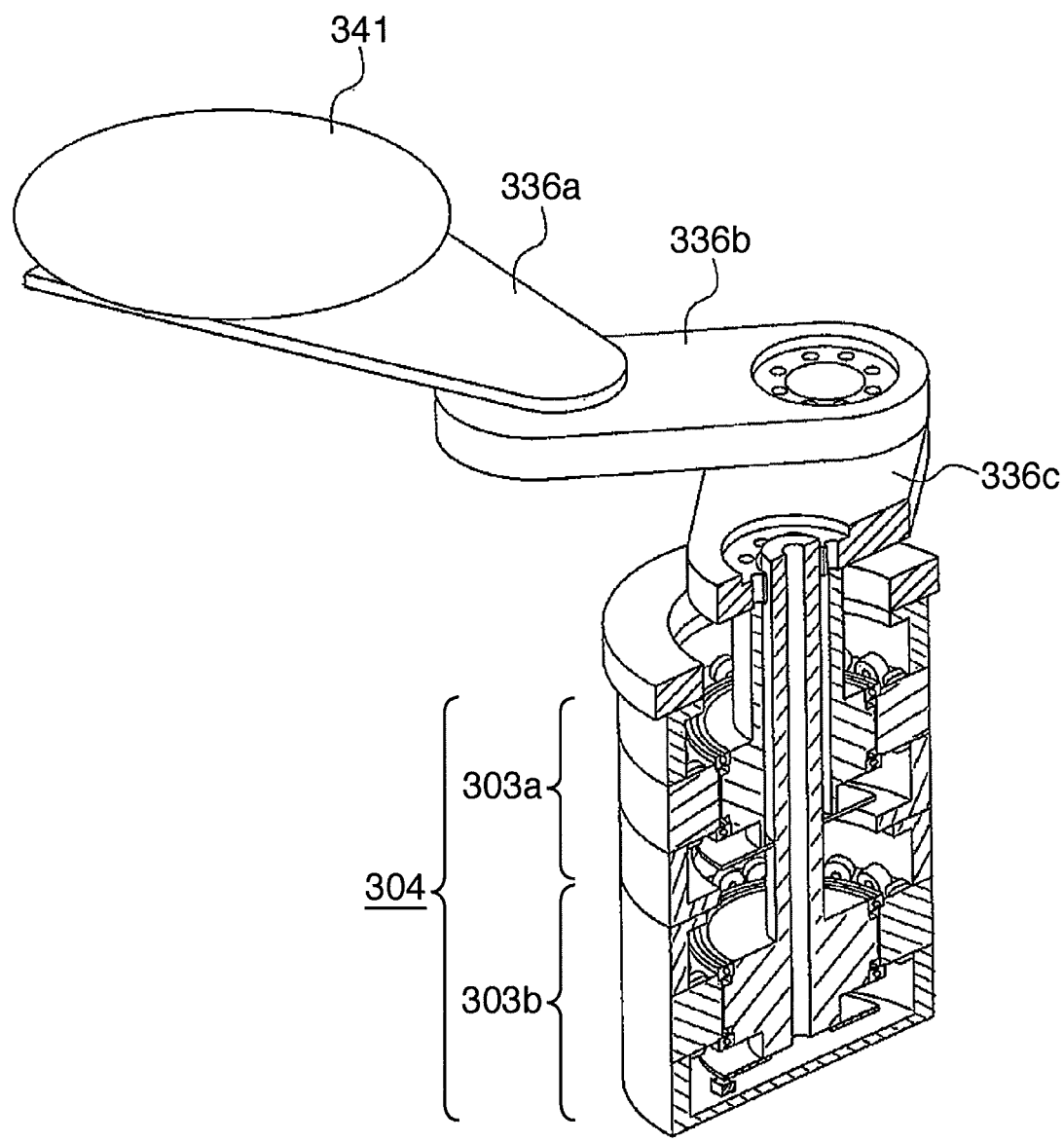
FIG. 19 shows an arrangement example (partial sectional view) of the transport robot to which the motor according to the third embodiment of the present invention is applied.
Figure 20:
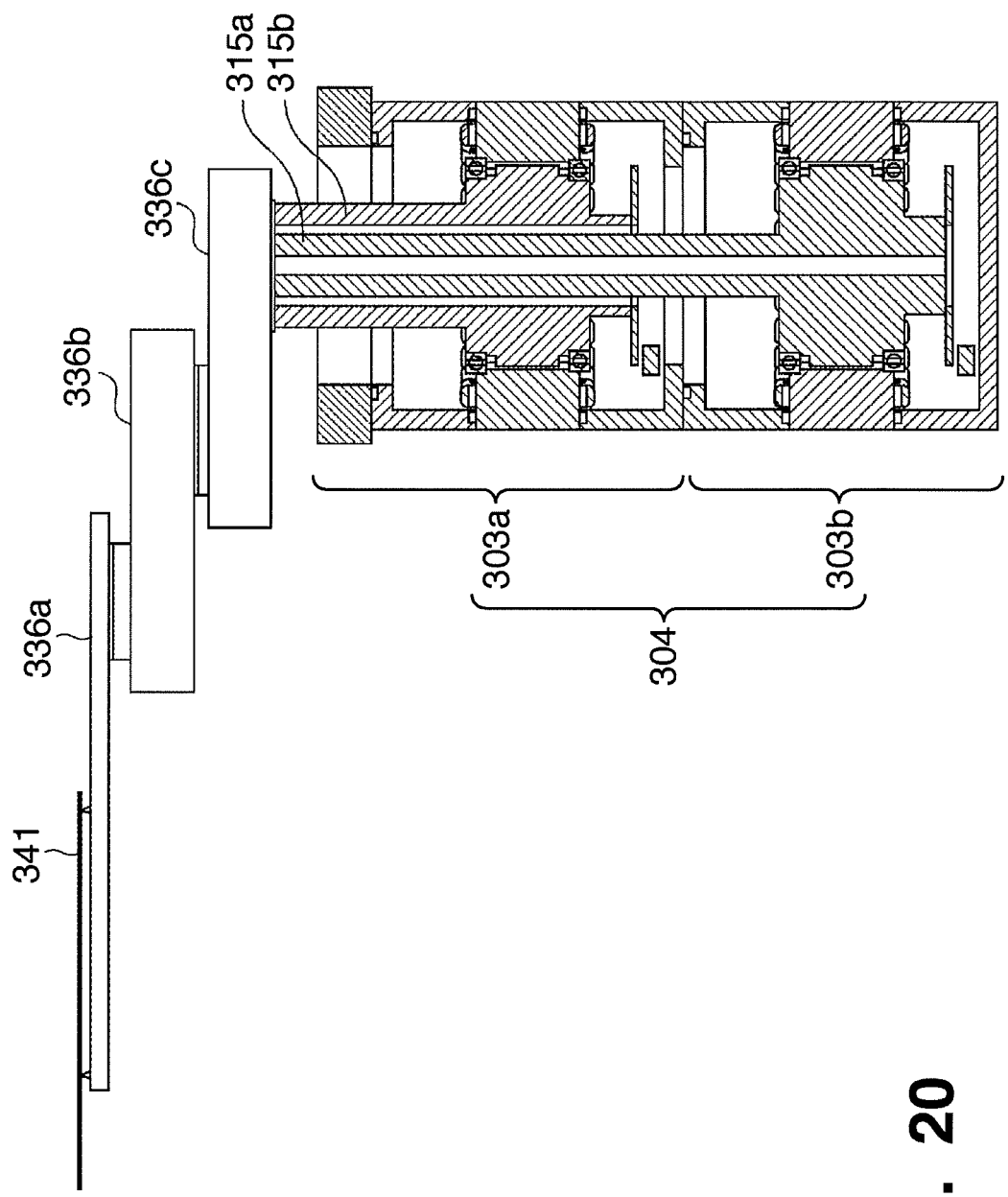
FIG. 20 shows an arrangement example (partial sectional view) of the transport robot to which the motor according to the third embodiment of the present invention is applied.

FIGS. 15 to 20 are views showing a motor according to the third embodiment of the present invention. FIG. 15 is a sectional perspective view of the motor, FIG. 16 is a longitudinal sectional view of the motor, and FIG. 17 is a sectional view taken along a line A-A in FIG. 16. FIGS. 18 to 20 show arrangement examples of a transport robot to which the motor is applied. Note that some constituent elements are not shown in these drawings for the sake of avoiding complexity.

In an actuator (a motor 303) shown in FIGS. 15 and 16, a rotor 307 is supported by a motor casing 305 to be free to rotate. The motor casing (vacuum partition wall) 305 can be attached to a vacuum vessel 301 so as to insert the distal end of the rotor 307 into an opening 301a formed in the wall surface of the vacuum vessel 301. While the motor casing 305 is attached to the vacuum vessel 301, the distal end of the rotor 307 can protrude into the vacuum vessel 301.

The motor casing (vacuum partition wall) 305 is an almost cylindrical closed-end vessel, the interior of which can be maintained in a vacuum atmosphere. The motor casing 305 includes, as its main constituent elements, a first housing 309 attached to the vacuum vessel 301, a stator 312 provided with coils 323, and a second housing 310 connected to the bottom portion of the stator 312. Also, the rotor 307 includes a shaft 315 serving as an output shaft, and a magnet member 317 which surrounds the shaft 315 to be opposed to the stator 312. The rotation axis of the rotor 307 and the vertical central axis of the motor casing 305 coincide with each other. Note that in this specification, the axial direction of the shaft 315 is defined as the vertical direction, the direction in which the vacuum vessel 301 is located is defined as the upward direction, and the direction in which the motor casing 305 is located is defined as the downward direction.

The motor casing 305 will be described first. The first housing 309 is attached to the surface of the vacuum vessel 301, which is on the lower side of the opening 301a formed in it, by a fastening member on the upper side of the motor casing 305, and includes a cylindrical upper wall portion 309a and an almost ring-shaped top plate 309b which are integrally connected to each other. The upper wall portion 309a forms part of the side surface of the motor casing 305. The top plate 309b is in contact with the vacuum vessel 301. A groove 309c in which an O-ring 309d is to be fitted is formed in the top plate 309b, and is maintained airtight by sandwiching the O-ring 309d between the bottom surface of the vacuum vessel 301, which surrounds the opening 1a, and the top plate 309b.

The upper wall portion 309a is airtightly connected to the upper portion of the stator 312 on the lower side of the motor casing 305, and an O-ring 312a is inserted in the connecting portion between the upper wall portion 309a and the stator 312.

The stator 312 is an almost cylindrical member which is airtightly connected to the lower portion of the first housing 309, and includes the plurality of coils 323 arrayed in a ring shape along its inner peripheral surface, as shown in FIG. 17. The stator 312 is airtightly connected to the upper portion of the second housing 310 in the lower portion of the motor casing 305, and an O-ring 310c is inserted in the connecting portion between the stator 312 and the second housing 310. The stator 312 is made of a material which has a low iron loss, such as a silicon steel plate, ferrite, or permalloy. The stator 312 is more preferably formed by axially (vertically) stacking a large number of plate members made of such a material.

The coils 323 are formed by repeatedly winding conductive wires around stator teeth 321 formed integrally with the stator 312 on the inner side of the motor casing 305. The stator teeth 321 are formed on the inner side of the positions at which the stator 312 is sealed by the O-rings 312a and 310c. Hence, the coils 323 are disposed on the inner side (vacuum side) of the motor casing 305.

Although FIG. 17 shows an arrangement example in which the coils 323 are 24 coils with three phases and eight poles and have 16 rotor-side poles, a known structure can be appropriately adopted as a combination of the coils 323 and the number of rotor-side poles. Also, although a wire which has a diameter of 1.0 mm and is coated with a PTFE (polytetrafluoroethylene) insulating film is used as the conductive wire wound around the stator tooth 321 in this embodiment, a known conductive wire such as a polyester enamel wire (φ1.0 PEW) can be appropriately adopted. Nevertheless, a wire coated with a PTFE insulating film which discharges a gas in only small amounts is more preferable. Note that the arrangement of the coil 323 will be described later.

The second housing 310 is an almost cylindrical closed-end member which is airtightly connected to the lower portion of the stator 312, and includes a cylindrical lower wall portion 310a which forms part of the side surface of the motor casing 305, and an almost disk-shaped bottom plate 310b which forms its bottom surface.

The rotor 307 will be described next. The shaft 315 is a main constituent element of the rotor 307, as mentioned above, and is supported to be free to rotate while at least its lower portion is inserted in the motor casing 305. The upper, distal end of the shaft 315 protrudes from the upper side of the motor casing 305 so that it can protrude into the vacuum vessel 301. The lower portion of the shaft 315 is coaxially fitted in the magnet member 317. The shaft 315 can be formed from a hollow tube-shaped member for inertia reduction.

The magnet member 317 is a main constituent element of the rotor 307, as mentioned above, and is fixed on the lower edge of the shaft 315 while the axis lines of the stator 312 and shaft 315 coincide with each other. The magnet member 317 in this embodiment includes an almost annular back yoke 325 fixed on the shaft 315, and a plurality of permanent magnets 327 which align themselves along the outer peripheral surface of the back yoke 325.

The back yoke 325 is a member which forms a flux path of the permanent magnets 327, and is made of a magnetic material typified by a silicon steel plate or ferrite. The back yoke 325 can have any shape as long as it can form a flux path, and may have, for example, a shape in which projections and grooves are formed in the inner or outer surface or that in which a plurality of holes are formed in it within the range in which this shape does not adversely affect the flux path.

The permanent magnets 327 include a plurality of segment permanent magnets magnetized such that a magnetic flux generated by them is oriented in the plate thickness direction. In this embodiment, 16 vertically elongated rectangular segment magnets are arrayed in a ring shape along the outer peripheral surface of the back yoke 325 so as to have alternate polarities. Also, to prevent cogging, the permanent magnets 327 more preferably have a fan-shaped or arcuated cross-sectional shape in the plate thickness direction of the permanent magnets 327.

An arbitrary permanent magnet made of a magnetic material such as an Sm-, Nd-, or ferrite-based material can be adopted as the permanent magnet 327, as a matter of course. Note that the permanent magnets 327 are preferably attached to the back yoke 25 with a skew angle between them to suppress cogging. Moreover, the permanent magnets 327 may be directly attached to the shaft 315 without providing the magnet member 317 with the back yoke 325, as a matter of course.

Characteristic arrangements in this embodiment will be described in more detail below. The stator 312 as a main feature of the motor 303 according to the present invention will be described first. The stator 312 integrated with the stator teeth 321 on which the coils 323 are formed functions as a vacuum partition wall. Thus, only a gap for use in interference prevention is necessary between the inner peripheral portion of the stator 312 and the outer peripheral portion of the magnet member 317, so the magnetic efficiency can be significantly improved.

Also, because the stator 312 itself serves as a vacuum partition wall, the exterior of the stator 312 is open to the atmospheric air. This makes it possible to obtain a great cooling effect against heat generation by a motor driving current. To attain a greater cooling effect, it is also possible to additionally provide the stator 312 with an air cooling mechanism or a water cooling mechanism without connecting a pipe into the vacuum. Bearings 331 and the coils 323 have features associated with the stator 312 with the foregoing arrangement.

The positions and effects of the bearings 331 will be described next. The bearings 331 are inserted in the gap between the outer peripheral portion of the magnet member 317 and the inner peripheral portion of the stator teeth 321. That is, the outer peripheral surfaces of two bearings 331 abut against the upper and lower edges, respectively, of the inner peripheral surface of the stator teeth 321 formed to overhang on the inner side of the stator 312, and the inner peripheral surfaces of the two bearings 331 abut against the upper and lower edges, respectively, of the outer peripheral surface of the magnet member 317.

In this manner, in the motor 303, the position of the rotor 307 relative to the stator 312 can be directly determined. This makes it possible to ensure a given coaxial accuracy between the stator 312 and the rotor 307. That is, it is possible to assemble the inner peripheral surface of the stator teeth 321 and the outer peripheral surface of the magnet member 317 with extremely high distance accuracy between them, and to bring the inner peripheral surface of the stator teeth 321 and the outer peripheral surface of the magnet member 317 close to each other. It is therefore possible to enhance the efficiency of the motor 303, reduce torque ripples, and improve the assembly performance.

Also, the rotor 307 can be supported only by two bearings 331. That is, the rotor 307 can have an arrangement in which it comes into contact with other members only in the lower portion of the shaft 315 and includes no bearing in its portion close to the vacuum vessel 301. In this case, even if a particle is generated in the bearing 331, it hardly reaches the interior of the vacuum vessel 301 upon passing through the opening 301a on its upper side. Moreover, because both the bearings 331 are adjacent to the magnet member 317 (permanent magnets 327), a magnetic particle can be removed upon adhering onto the magnet member 317.

The bearing 331 may be disposed on only one of the upper and lower edges of the outer peripheral surface of the magnet member 317, as a matter of course. In this case as well, a magnetic particle can be removed upon adhering onto the magnet member 317. However, the position of the bearing 331 is not limited to this.

The arrangement of the coils 323 will be described next. The coils 323 are formed by winding conductive wires around the stator teeth 321. The surface areas of the coils 323 in the present invention, which are exposed to the vacuum region, can be reduced by solidifying a resin or ceramics impregnated into the gaps between the individual conductive wires and those between the conductive wires and the stator teeth 321 (impregnation treatment). By impregnating, for example, the gaps between the individual conductive wires with, for example, a resin in this way, the surface areas of the coils 323 can be reduced to suppress discharge of an out-gas.

Almost the same effect can also be obtained by covering the surfaces of the conductive wire portions with a resin or ceramics. That is, by impregnating only the outer regions of the conductive wires wound around the stator teeth 321 with a resin or ceramics, and solidifying it, the surface areas of the coils 323 exposed to the vacuum region can be reduced to suppress discharge of an out-gas.

In this embodiment, PPS (polyphenylene sulfide) resin used in packaging, for example, a semiconductor element is employed as the material to be impregnated into portions of the coils 323. When PPS resin is used, portions of the coils 323 or portions in which the coils 323 are integrated with the stator 312 placed in the vacuum are preferably covered with the PPS resin to form a PPS resin mold.

As a method of forming a PPS resin mold, a method of placing a metal mold around the stator 312 having already undergone coil winding, and heating, melting, and supplying PPS pellets (grain-like source materials) into the minute portions of the coils 323 by means of a capillary phenomenon, and cooling them, while they surround the stator 312, can be employed. At this time, the coils 323 are firmly fixed to be capable of sealing not only such that the wires (winding wires) of the coils 323 cannot be seen from the exterior of the PPS mold but also so as to prevent generation of any leakage path upon degassing from the interior of the coils 323. Naturally, a member which insulates the coil conductive wires have a heat resistance high enough to withstand the temperatures at that time.

The above-mentioned method of forming a PPS resin mold is also applicable when the stator 312 is formed by axially (vertically) stacking a large number of plate members made of a material such as a silicon steel plate, ferrite, or permalloy. In this case, when the surrounding environment of the stator 312 while the coils 323 are formed is set in a reduced pressure atmosphere, and thereupon PPS pellets are melted, the PPS pellets can be more easily supplied into the gap of the stator 312 and minute portions of the coils 323, thereby effectively eliminating any leakage path.

Besides PPS resin, insulating materials such as epoxy resin, an insulating coating, and water glass can also be used. If, for example, epoxy resin is used, fixation by the epoxy resin considerably reduces the surface area of a portion, which comes into contact with a vacuum, of a component in the vacuum, and decreases the amount of adsorption gas, thereby allowing driving transmission into the vacuum without adversely affecting the vacuum atmosphere.

A substrate transport robot which uses the motor 303 will be described below. A direct-drive substrate transport robot in which the horizontal substrate support position can be changed in the vacuum vessel 301 in accordance with the rotation angle of the shaft 315 can be formed by attaching, to the distal end of the shaft 315, a substrate mounting member (arm) on which a substrate, for example, can be mounted.

Arrangement examples of the substrate transport robot to which the motor 303 is applied will be described in more detail later.

FIGS. 18 to 20 show arrangement examples of a substrate transport robot (scalar robot) to which a motor 304 to which two motors 303 in the present invention are vertically connected to each other. The motor 304 is suitably applicable as a driving source for a scalar robot, and includes two vertically stacked motors 303a and 303b with the same arrangement as the motor 303. Also, an outer shaft 315b which is a shaft of the upper motor 303a, and an inner shaft 315a which is a shaft of the lower motor 303b are coaxially disposed to be independently controllable in rotation.

The outer shaft 315b is connected to an arm 336c, and the inner shaft 315a is connected to the arm 336c so as to pivot in synchronism with an arm 336b via a belt (not shown) suspended in the arm 336c. Therefore, movement, in the front-to-back direction and rotation direction (horizontal direction), of an arm 336a on which a substrate 341 is mounted can be controlled by controlling rotation of the motors 303a and 303b. Note that the arm portion has an arrangement known as a general scalar arm.

It is preferable to connect the motor 304 (motor 303a) and the vacuum vessel 301 to each other via a vertically expandable bellows pipe (not shown), and provide the atmospheric-side portion of the casing of the motor 304 with a known vertical moving mechanism which adjusts the level position of the motor 304. With this arrangement, the arm 336a can be controlled to move horizontally and vertically. Thus, a substrate transport robot which horizontally and vertically transports a substrate in the vacuum vessel 301 can be formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-295148, filed Dec. 25, 2009, Japanese Patent Application No. 2010-047573, filed Mar. 4, 2010, and Japanese Patent Application No. 2010-047574, filed Mar. 4, 2010, which are hereby incorporated by reference herein in their entirety.

What is claimed is:

1. A vacuum actuator comprising:
   a vacuum partition wall, an interior of which can be evacuated to a vacuum atmosphere;
   a rotor provided inside said vacuum partition wall to be free to rotate;
   a permanent magnet provided on an outer peripheral surface of said rotor;
   a stator which forms a part of said vacuum partition wall, wherein an inner peripheral surface of said stator is exposed to the vacuum atmosphere, and an outer peripheral surface of said stator is exposed to an atmospheric environment; and
   a coil provided with the outer peripheral surface of said stator and exposed to the atmospheric environment,
   wherein said rotor is supported by said vacuum partition wall via a bearing provided in a gap between said rotor and said stator, and
   said bearing has an outer peripheral surface which abuts against an inner peripheral surface of said stator, and an inner peripheral surface which abuts against an outer peripheral surface of said rotor and is configured not to contact with said permanent magnet provided on the outer peripheral surface of said rotor, and
   said permanent magnet is provided in a space surrounded by the outer peripheral surface of said rotor and the inner peripheral surface of said stator and said bearing.

2. The actuator according to claim 1, wherein
   said stator includes a sealing partition wall which forms part of said vacuum partition wall, and a plurality of stator teeth which are radially arranged to be integrated with said sealing partition wall and to penetrate through a vacuum-side portion and atmospheric-side portion of said sealing partition wall, and
   said coil is formed on an atmospheric side of said stator teeth.

3. The actuator according to claim 1, wherein said stator includes a sealing partition wall which forms part of said vacuum partition wall, and a plurality of stator teeth which are radially arranged only on an atmospheric side of said sealing partition wall and on each which said coil is formed.

4. The actuator according to claim 3, wherein
   said sealing partition wall includes a slit which is axially formed in an inner surface thereof to be evacuated to a vacuum, and
   said slit is formed between said stator teeth.

5. The actuator according to claim 2, wherein said stator teeth are made of a material with a magnetic permeability higher than said sealing partition wall.

6. The actuator according to claim 1, wherein said stator includes, on the inner side of said vacuum partition wall, stator teeth on each of which said coil is formed.

7. The actuator according to claim 6, wherein said coil is covered with an insulating resin.

8. The actuator according to claim 6, wherein at least a portion, which is exposed to a vacuum side, of said stator is covered with an insulating resin.

9. The actuator according to claim 1, wherein said rotor is supported only by said bearing.

10. The actuator according to claim 1, wherein the outer peripheral surface of said bearing abuts against said stator teeth.

11. A substrate transport robot comprising
    a vacuum actuator defined in claim 1, which serves as a driving source.

12. The actuator according to claim 1, wherein said stator is configured to function as said vacuum partition wall.

* * * * *